US012772536B2

(12) United States Patent
Kim et al.

(10) Patent No.: US 12,772,536 B2
(45) Date of Patent: Oct. 20, 2026

(54) SEMICONDUCTOR TRANSISTORS PROVIDING VARIOUS OPERATING VOLTAGES

(71) Applicant: Samsung Electronics Co., Ltd., Suwon-si (KR)

(72) Inventors: Juyoun Kim, Suwon-si (KR); Sangjung Kang, Suwon-si (KR); Jinwoo Kim, Hwaseong-si (KR); Jihwan An, Seoul (KR); Seulgi Yun, Hwaseong-si (KR)

( * ) Notice: Subject to any disclaimer, the term of this patent is extended or adjusted under 35 U.S.C. 154(b) by 12 days.

(21) Appl. No.: 18/743,588

(22) Filed: Jun. 14, 2024

(65) Prior Publication Data

US 2024/0339514 A1 Oct. 10, 2024

Related U.S. Application Data

(62) Division of application No. 17/120,784, filed on Dec. 14, 2020, now Pat. No. 12,046,650.

(30) Foreign Application Priority Data

Apr. 16, 2020 (KR) ........................ 10-2020-0045922

(51) Int. Cl.
*H10D 64/27* (2025.01)
*H10D 64/66* (2025.01)
(Continued)

(52) U.S. Cl.
CPC ......... *H10D 64/514* (2025.01); *H10D 64/519* (2025.01); *H10D 64/665* (2025.01);
(Continued)

(58) Field of Classification Search
CPC ........... H01L 29/42364; H01L 29/4238; H01L 29/495; H01L 21/82345; H01L 21/823462;
(Continued)

(56) References Cited

U.S. PATENT DOCUMENTS 9,202,698 B2 * 12/2015 Jagannathan ...... H10D 64/0135
9,502,416 B1 * 11/2016 Kim ...................... G11C 11/412
(Continued)

FOREIGN PATENT DOCUMENTS

KR 10-2015-0077545 A 7/2015
KR 10-2016-0067618 A 6/2016
(Continued)

*Primary Examiner* — Maliheh Malek
(74) *Attorney, Agent, or Firm* — Wolf, Greenfield & Sacks, P.C.

(57) ABSTRACT

A semiconductor device includes a substrate having a first, a second, a third, and a fourth region; a first gate structure in the first region and including a first gate dielectric layer, and a first, a second, and a third conductive layer; a second gate structure in the second region and including a second gate dielectric layer, and the second and the third conductive layer; a third gate structure in the third region and including a third gate dielectric layer, and the second and the third conductive layer; and a fourth gate structure in the fourth region and including the second gate dielectric layer, and a fourth and the third conductive layer. The first gate dielectric layer includes a material of the second gate dielectric layer and a first element, and the third gate dielectric layer includes a material of the second gate dielectric layer and a second element.

11 Claims, 19 Drawing Sheets

(51) Int. Cl.
*H10D 84/01* (2026.01)
*H10D 84/03* (2025.01)
*H10D 84/83* (2025.01)
*H10D 84/85* (2025.01)

(52) U.S. Cl.
CPC ....... *H10D 84/014* (2025.01); *H10D 84/0144* (2025.01); *H10D 84/038* (2025.01); *H10D 84/83* (2025.01); *H10D 84/85* (2025.01)

(58) Field of Classification Search
CPC ............... H01L 27/088; H01L 27/0886; H01L 21/823431; H01L 21/02175; H01L 29/785; H01L 27/092; H10D 84/0172–0179; H10D 84/966; H10D 84/0181; H10D 64/514; H10D 64/519; H10D 64/665; H10D 84/014; H10D 84/0144; H10D 84/038; H10D 84/83; H10D 84/85; H10D 84/834; H10D 84/0158; H10D 30/62; H10P 14/6939
See application file for complete search history.

(56) References Cited

U.S. PATENT DOCUMENTS 9,647,116 B1 * 5/2017 Lee .................... H10D 30/0212
9,748,145 B1 * 8/2017 Kannan ................ H10D 64/017
9,780,183 B2 * 10/2017 Kim ..................... H10D 64/514
10,002,939 B1 * 6/2018 Cheng .................... B82Y 10/00
10,217,640 B2 * 2/2019 Choi .................... H10D 30/024
10,651,172 B2 5/2020 Ha et al.
10,700,064 B1 * 6/2020 Zhang .................... B82Y 10/00
11,043,430 B2 6/2021 Kim
11,107,736 B1 * 8/2021 Cheng .................. H10D 30/031
11,158,635 B2 * 10/2021 Shao ................ H10D 64/01318
11,164,869 B2 11/2021 Ha et al.
11,575,018 B2 2/2023 Kim et al.
11,710,667 B2 * 7/2023 Hsu ...................... H10D 30/014 257/295
12,046,650 B2 * 7/2024 Kim ..................... H10D 64/514
2007/0075351 A1 * 4/2007 Schulz ............... H10D 30/0241 257/E21.639
2007/0111448 A1 * 5/2007 Li ........................ H10D 30/024 257/E21.639
2010/0129968 A1 * 5/2010 Li ........................ H10D 30/024 438/587
2013/0020630 A1 * 1/2013 Lee ........................ H10D 30/60 257/E21.24
2013/0149854 A1 * 6/2013 Ishii ..................... H10D 64/013 438/587
2013/0285150 A1 * 10/2013 Chen ........................ H10D 1/47 257/369
2013/0334584 A1 * 12/2013 Tang ...................... H10B 41/49 257/315
2015/0069524 A1 * 3/2015 Hong ................. H10D 30/0227 438/587
2015/0187763 A1 * 7/2015 Kim ....................... H10B 10/12 257/368
2015/0380548 A1 * 12/2015 Wang ..................... H10B 41/27 257/329
2016/0035329 A1 * 2/2016 Ekstrand .............. G10H 1/0091 381/61
2016/0043005 A1 * 2/2016 You .................... H10D 30/0227 438/221
2016/0163708 A1 * 6/2016 Jang .................... G11C 11/4085 257/369
2016/0178137 A1 * 6/2016 Jiang ....................... F21V 3/061 362/221
2016/0225868 A1 * 8/2016 Kim ..................... H10D 64/514
2016/0268284 A1 * 9/2016 Wu ........................ H10B 10/18
2016/0315171 A1 * 10/2016 Hung ............... H10D 64/01318
2016/0355654 A1 * 12/2016 Luo ..................... C08F 4/65912
2016/0358921 A1 * 12/2016 Park ....................... H10D 30/62
2017/0021318 A1 * 1/2017 Mclver .................. B65D 88/32
2017/0159894 A1 6/2017 Jiang
2017/0243789 A1 * 8/2017 Ando ................... H10D 30/027
2017/0256544 A1 * 9/2017 Chai .................... H10D 30/014
2017/0278856 A1 * 9/2017 Yamaguchi ............ H10B 43/00
2017/0335718 A1 * 11/2017 McCune .................... F02C 7/32
2018/0166560 A1 * 6/2018 Chiang ................ H10D 30/024
2018/0197790 A1 * 7/2018 Jeon ..................... H10D 30/025
2019/0088798 A1 * 3/2019 Kim ....................... B82Y 10/00
2019/0189613 A1 * 6/2019 Ha ....................... H10D 30/024
2019/0214478 A1 * 7/2019 Kim ....................... H10B 10/12
2019/0378927 A1 * 12/2019 Lin ...................... H10D 30/024
2020/0105602 A1 * 4/2020 Wu ........................ H10D 64/01
2020/0287017 A1 * 9/2020 Chang ................ H10D 30/0415
2020/0312727 A1 * 10/2020 Kang ................. H10D 84/0144
2020/0335403 A1 * 10/2020 Kim ................. H10D 64/01318
2020/0335581 A1 * 10/2020 Li ........................ H10D 30/025
2021/0091202 A1 * 3/2021 He ..................... H10D 64/0134
2021/0305251 A1 * 9/2021 Shao ................ H10D 64/01318
2021/0313333 A1 * 10/2021 Liaw ...................... H10B 10/12
2021/0328038 A1 * 10/2021 Kim ..................... H10D 30/014
2021/0399109 A1 * 12/2021 Su ........................ H10D 30/014
2022/0068907 A1 * 3/2022 Tura ....................... B82Y 10/00
2022/0108989 A1 * 4/2022 Kang .................... G11C 11/412
2022/0238381 A1 * 7/2022 Chen .................... H10D 64/691
2022/0302115 A1 * 9/2022 Park ................... H10D 30/6219
2022/0320284 A1 * 10/2022 Chen .................... H10D 30/014
2022/0359501 A1 * 11/2022 Akaiwa .............. H10D 84/0149
2023/0146060 A1 * 5/2023 Park ..................... H10D 64/017 257/324
2023/0163213 A1 * 5/2023 Lee ........................ H10D 30/62 257/30
2023/0170398 A1 * 6/2023 Park ..................... H10D 30/014 257/288
2023/0178625 A1 * 6/2023 Kim ..................... H10D 30/014
2023/0197725 A1 * 6/2023 Weng ............... H10D 64/01322
2023/0200077 A1 * 6/2023 Lee ........................ H10B 43/27 257/314
2023/0215930 A1 * 7/2023 Chung ................. H10D 30/014 257/30
2023/0223319 A1 * 7/2023 Do ........................ G06F 30/394 257/774
2023/0238441 A1 * 7/2023 Park ..................... H10D 30/014 257/288
2023/0268412 A1 * 8/2023 Jung .................... H10D 30/014 257/288
2023/0298945 A1 * 9/2023 Yang .................... H10D 30/014
2023/0307448 A1 * 9/2023 Lee ...................... H10D 30/014
2023/0378167 A1 * 11/2023 Lee .................... H10D 84/0142
2023/0387118 A1 * 11/2023 Bae ...................... H10D 30/014
2023/0420552 A1 * 12/2023 Park ..................... H10D 30/014
2024/0347538 A1 * 10/2024 Yoon .................. H10D 30/0415
2025/0204028 A1 * 6/2025 Lin ...................... H10D 30/603

FOREIGN PATENT DOCUMENTS

KR 10-2016-0095399 A 8/2016
KR 10-2019-0000965 A 1/2019
KR 10-2019-0028606 A 3/2019
KR 10-2019-0059665 A 5/2019
KR 10-2019-0072068 A 6/2019
KR 10-2019-0085596 A 7/2019
KR 10-2020-0001169 A 1/2020

* cited by examiner

SEMICONDUCTOR TRANSISTORS PROVIDING VARIOUS OPERATING VOLTAGES

CROSS-REFERENCE TO RELATED APPLICATION(S)

This application is a divisional of and claims priority to U.S. application Ser. No. 17/120,784, filed Dec. 14, 2020, which claims benefit of priority to Korean Patent Application No. 10-2020-0045922 filed on Apr. 16, 2020, the disclosure of which is incorporated herein by reference in its entirety.

FIELD

The present inventive concepts relate to semiconductor devices.

BACKGROUND

As demand for high performance, high speed, and/or multifunctionality in semiconductor devices increases, a degree of integration of semiconductor devices is increasing. With the trend toward a high degree of integration of semiconductor devices, scaling down of transistors in semiconductor devices has been accelerated, and methods for forming transistors having reduced sizes and capable of providing various operating voltages have been studied.

SUMMARY

An aspect of the present inventive concepts is to provide a semiconductor device having improved electrical characteristics.

According to an example embodiment, a semiconductor device includes a substrate having a first region, a second region, a third region, and a fourth region; a first gate structure in the first region and including a first gate dielectric layer, a first conductive layer, a second conductive layer, and a third conductive layer, stacked in sequence; a second gate structure in the second region and including a second gate dielectric layer, the second conductive layer, and the third conductive layer, stacked in sequence; a third gate structure in the third region and including a third gate dielectric layer, the second conductive layer, and the third conductive layer, stacked in sequence; and a fourth gate structure in the fourth region and including the second gate dielectric layer, a fourth conductive layer, and the third conductive layer, stacked in sequence, wherein the first gate dielectric layer includes a material of the second gate dielectric layer and a first element, and the third gate dielectric layer includes a material of the second gate dielectric layer and a second element that is different from the first element.

According to an example embodiment, a semiconductor device includes a substrate having a first region and a second region; a first gate structure in the first region, and including a first gate dielectric layer, a first conductive layer, a second conductive layer, and a third conductive layer, stacked in sequence; and a second gate structure in the second region, and including a second gate dielectric layer, the second conductive layer and the third conductive layer, stacked in sequence, wherein the first gate dielectric layer and the first conductive layer include a first element, wherein the second conductive layer and the second gate dielectric layer are free of the first element.

According to an example embodiment, a semiconductor device includes a substrate having a first region and a second region; a first gate structure that includes a first gate dielectric layer including a first dielectric and a first element doped in the first dielectric, a first conductive layer which is a metal layer including the first element, and a second conductive layer, stacked in sequence in the first region; and a second gate structure that includes a second gate dielectric layer including the first dielectric, and a third conductive layer, stacked in sequence in the second region, wherein the second conductive layer and the third conductive layer include a same material, and a thickness of the third conductive layer is less than or equal to a thickness of the second conductive layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Figure 1:
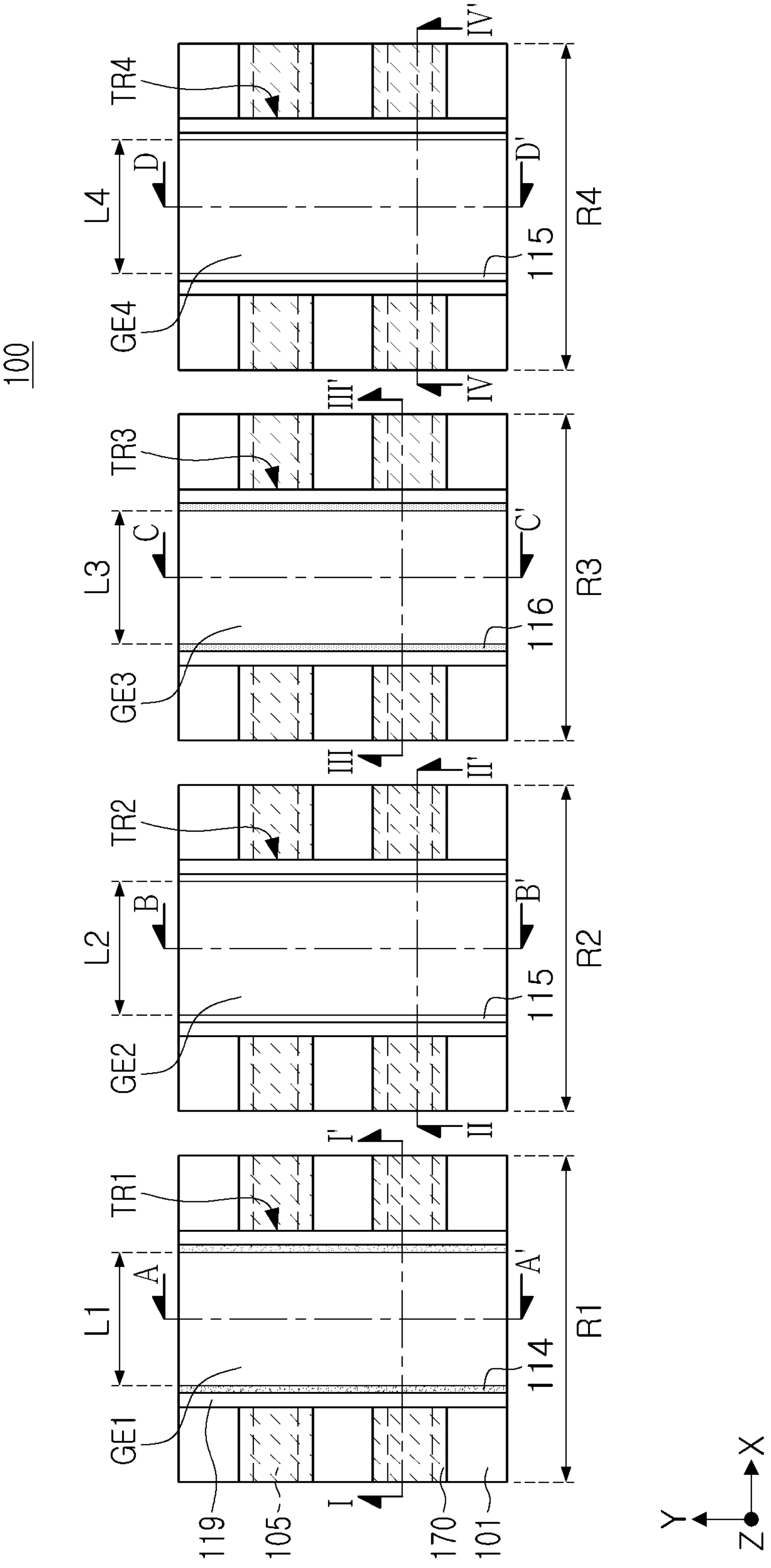
FIG. 1 is a plan view illustrating a semiconductor device according to example embodiments.

FIG. 1 is a plan view illustrating a semiconductor device according to example embodiments.

Figure 2A:
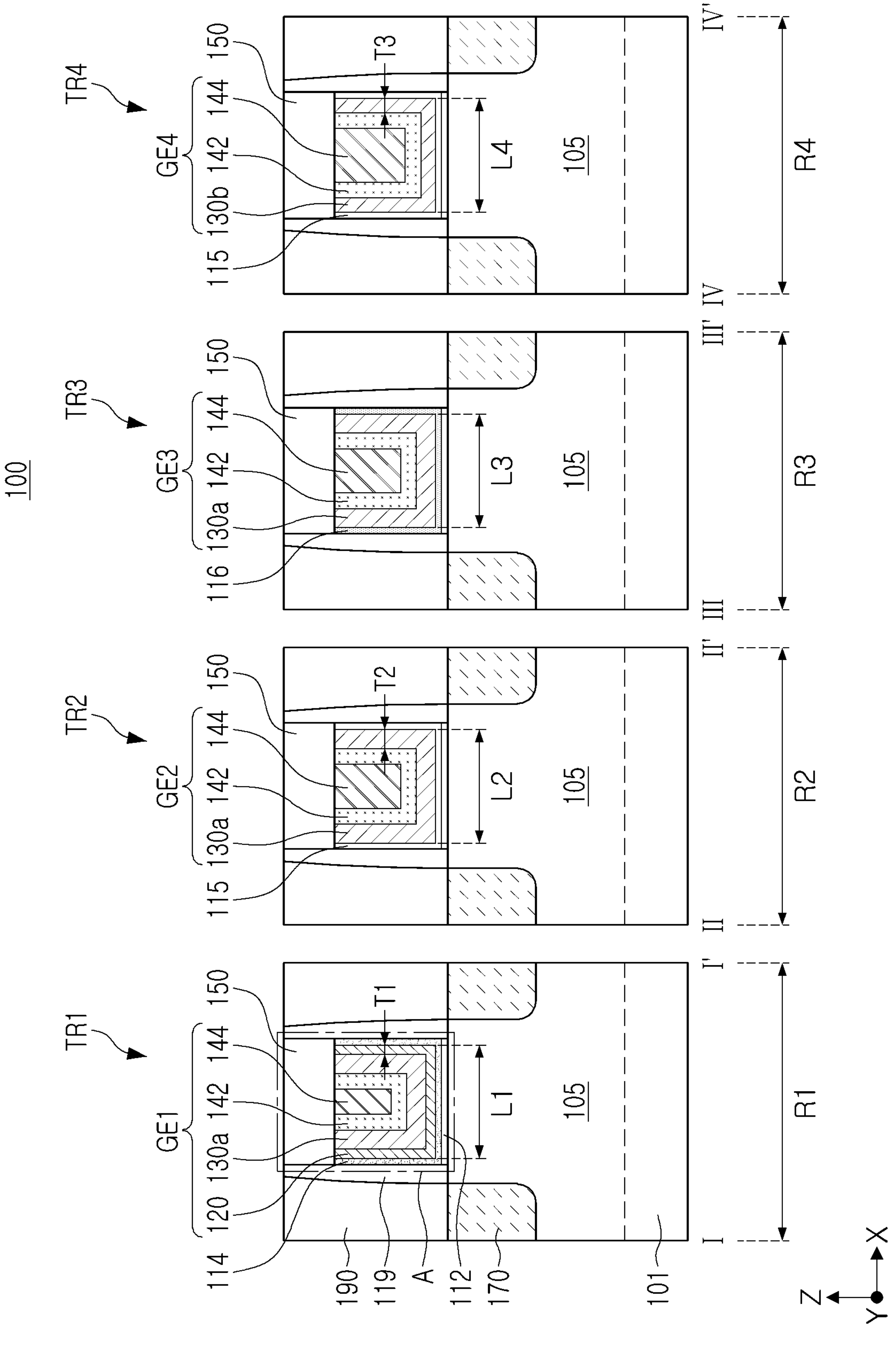
FIGS. 2A and 2B are cross-sectional views illustrating a semiconductor device according to example embodiments.
Figure 2B:
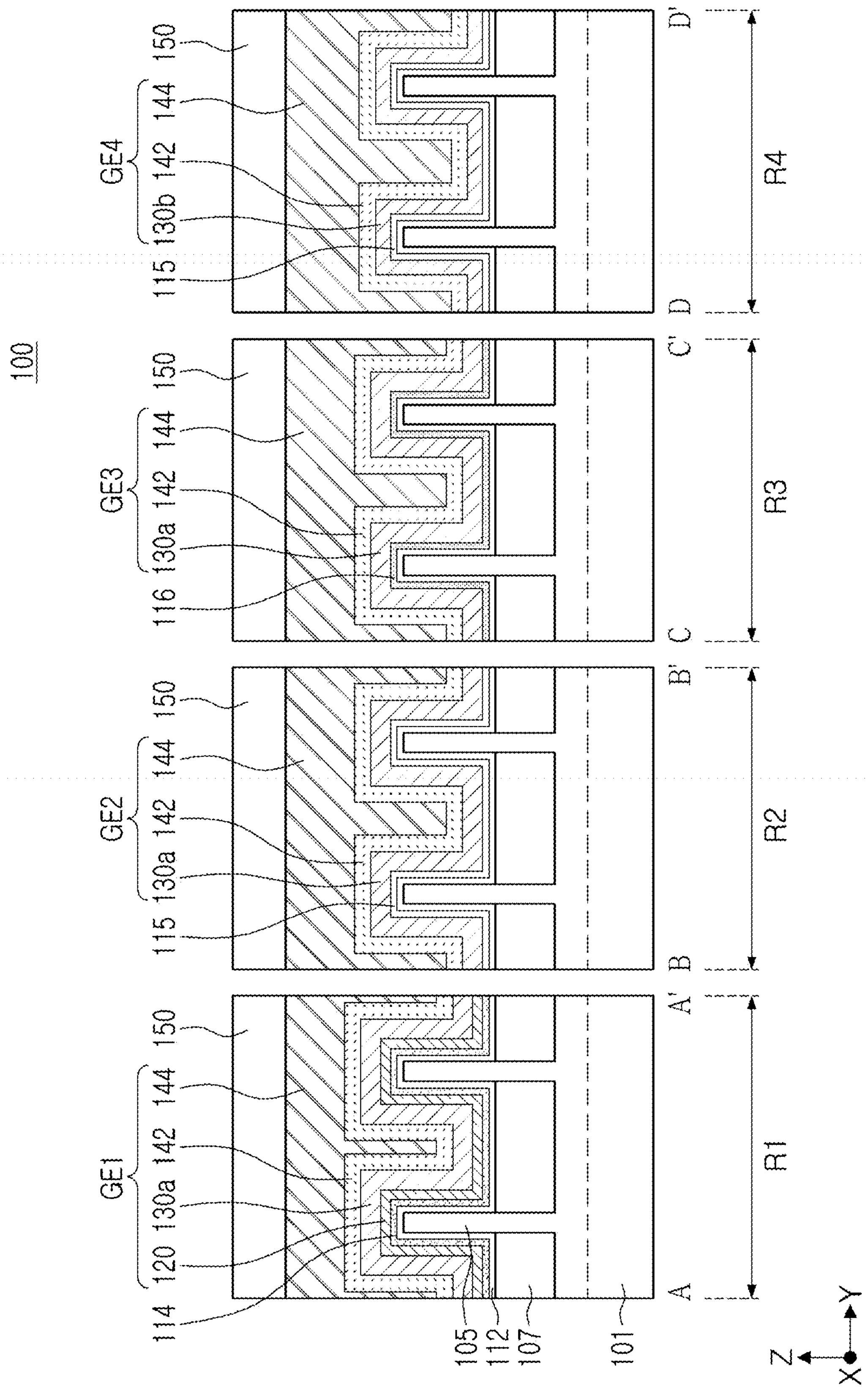

FIGS. 2A and 2B are cross-sectional views illustrating a semiconductor device according to example embodiments. FIG. 2A illustrates cross-sections of the semiconductor device of FIG. 1 taken along cut lines I-I', II-II', III-III', and IV-IV'. FIG. 2B illustrates cross-sections of the semiconductor device of FIG. 1 taken along cut lines A-A', B-B', C-C', and D-D'. For convenience of description, not all components of the semiconductor device are illustrated in FIGS. 1 to 2B.

Referring to FIGS. 1 to 2B, a semiconductor device 100 may include a substrate 101 having first to fourth regions R1, R2, R3, and R4, active fins 105, source/drain regions 170, interface layers 112, first to third gate dielectric layers 114, 115, and 116, gate spacer layers 119, and first to fourth gate electrode layers GE1, GE2, GE3, and GE4. As used herein, the terms "first," "second," "third," etc. are used merely to distinguish one element or layer from another. The semiconductor device 100 may further include device isolation layers 107, a gate capping layer 150, and an interlayer insulating layer 190.

The semiconductor device 100 may include FinFET devices in which the active fins 105 have a fin structure. The FinFET devices may include first to fourth transistors TR1, TR2, TR3, and TR4 disposed around or defined by the active fins 105 and the first to fourth gate electrode layers GE1, GE2, GE3, and GE4, with the active fins 105 and the gate electrode layers GE1 to GE4 intersecting each other. For example, all of the first to fourth transistors TR1, TR2, TR3, and TR4 may be p-type MOSFET. The first to fourth transistors TR1, TR2, TR3, and TR4 may be transistors, operated with or otherwise having different respective threshold voltages, and may constitute the same or different circuits in the semiconductor device 100.

The substrate 101 may have first to fourth regions R1, R2, R3, and R4, different from each other, and the first to fourth regions R1, R2, R3, and R4 may be regions in which the first to fourth transistors TR1, TR2, TR3, and TR4 are disposed, respectively. The first to fourth regions R1, R2, R3, and R4 may be spaced apart from each other or may be disposed adjacent to each other in the semiconductor device 100.

The substrate 101 may have an upper surface extending in x and y directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a Silicon On Insulator (SOI) layer, a Semiconductor On Insulator (SeOI) layer, or the like.

The device isolation layers 107 may define the active fins 105 on the substrate 101, as illustrated in FIG. 2B. The device isolation layers 107 may be formed by, for example, a shallow trench isolation (STI) process. According to embodiments, the device isolation layers 107 may include a region extending deeper into a lower portion of the substrate 101 between adjacent active fins 105. According to embodiments, the device isolation layers 107 may have a curved upper surface having a higher level closer to or adjacent the active fins 105, and shapes of upper and lower surfaces of the device isolation layers 107 are not limited to those illustrated. The device isolation layers 107 may be made of an insulating material. The device isolation layers 107 may include, for example, oxide, nitride, or a combination thereof.

The active fins 105 may be defined by the device isolation layers 107 in the substrate 101, and may be arranged to extend in one direction, for example, in the x-direction. The active fins 105 may have a linear shape or a bar shape protruding from the substrate 101 between the device isolation layers 107. In FIG. 1, a pair of active fins 105 spaced apart from each other in the y direction is illustrated in each of the first to fourth regions R1, R2, R3, and R4, but arrangement and the number of active fins 105 are not limited thereto. For example, one or three or more active fins 105 may be disposed in each of the first to fourth regions R1, R2, R3, and R4. The active fins 105 may be formed of a portion of the substrate 101, or may include an epitaxial layer grown from the substrate 101. The active fins 105 may be partially recessed on both sides of the first to fourth gate electrode layers GE1, GE2, GE3, and GE4, and the source/drain regions 170 may be disposed on the recessed active fins 105. Therefore, as illustrated in FIG. 2B, the active fins 105 may have a relatively high height below the first to fourth gate electrode layers GE1, GE2, GE3, and GE4. In example embodiments, the active fins 105 may include impurities. In example embodiments, the active fins 105 may be omitted, and in this case, the semiconductor device 100 may include active regions having a planar upper surface.

The source/drain regions 170 may be disposed on the active fins 105 on both (e.g., opposing) sides of the first to fourth gate electrode layers GE1, GE2, GE3, and GE4. The source/drain regions 170 may be provided as a source region or a drain region of the first to fourth transistors TR1, TR2, TR3, and TR4. Upper surfaces of the source/drain regions 170 may be located at the same position as or a position similar to (e.g., substantially coplanar with) lower surfaces of the first to fourth gate electrode layers GE1, GE2, GE3, and GE4 or lower surfaces of the interface layers 112. According to embodiments, the source/drain regions 170 may be connected to or merged with each other on two or more active fins 105 to form a single source/drain region 170.

The source/drain regions 170 may be formed of epitaxial layers and may include impurities. For example, the source/drain regions 170 may include p-type doped silicon germanium (SiGe). When the source/drain regions 170 include silicon germanium (SiGe), stress may be applied to channel regions of the first to fourth transistors TR1, TR2, TR3, and TR4, which may be regions of the active fins 105 made of silicon (Si), to improve mobility of holes. In example embodiments, the source/drain regions 170 may include a plurality of regions including different concentrations of elements and/or doping elements.

First to fourth gate structures may be disposed in the first to fourth regions R1, R2, R3, and R4, respectively. The first to fourth gate structures may include the interface layers 112, the first to third gate dielectric layers 114, 115, and 116, the gate spacer layers 119, the first to fourth gate electrode layers GE1, GE2, GE3, and GE4, and the gate capping layer 150.

The interface layers 112 and the first to third gate dielectric layers 114, 115, and 116 may be arranged between the active fins 105 and the first to fourth gate electrode layers GE1, GE2, GE3, and GE4. The first gate dielectric layer 114 may be disposed in the first region R1, and the second gate dielectric layers 115 may be disposed in the second and fourth regions R2 and R4. The third gate dielectric layer 116 may be disposed in the third region R3. The first to third gate dielectric layers 114, 115, and 116 may be disposed to cover lower surfaces and both (e.g., opposing) side surfaces of the first to fourth gate electrode layers GE1, GE2, GE3, and GE4. In example embodiments, the first to third gate dielectric layers 114, 115, and 116 may be formed only on the lower surfaces of the first to fourth gate electrode layers GE1, GE2, GE3, and GE4.

The interface layers 112 may be made of a dielectric material, for example, silicon oxide, silicon oxynitride, or a combination thereof. The first to third gate dielectric layers 114, 115, and 116 may include an oxide, a nitride, or a high-k material. The high-k material may refer to a dielectric material having a higher dielectric constant than that of the silicon oxide film ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and prascodymium oxide ($Pr_2O_3$).

The first to third gate dielectric layers 114, 115, and 116 may include different materials. The first gate dielectric layer 114 may be made of the same dielectric material as the second gate dielectric layer 115, and may further include a first element doped or diffused in the dielectric material. For example, the first element may include at least one of aluminum (Al), tantalum (Ta), tungsten (W), manganese (Mn), chromium (Cr), ruthenium (Ru), platinum (Pt), gallium (Ga), germanium (Ge), or gold (Au). The first element may be an element diffused from the first conductive layer 120 of the first gate electrode layer GE1. In this case, for example, when the first element is aluminum (Al), a concentration of aluminum (Al) diffused in the first gate dielectric layer 114 may be lower than a concentration of aluminum (Al) in the aluminum oxide ($Al_2O_3$). The first element may change an interface between the first gate dielectric layer 114 and the first gate electrode layer GE1 to lower a threshold voltage of the first transistor TR1. In example embodiments, the interface layer 112 of the first region R1 may also include the first element diffused from the first gate dielectric layer 114.

The third gate dielectric layer 116 may be made of the same dielectric material as the second gate dielectric layer 115, and may further include a second element doped or diffused in the dielectric material. The second element may be an element that is configured to increase a threshold voltage of a transistor. For example, the second element may include at least one rare earth element of lanthanum (La), gadolinium (Gd), lutetium (Lu), yttrium (Y), or scandium (Sc). The elements may form, for example, an electric dipole to increase a threshold voltage of the third transistor TR3. The third gate dielectric layer 116 may not include the first element, and the first gate dielectric layer 114 may not include the second element. In example embodiments, the interface layer 112 of the third region R3 may also include the second element diffused from the third gate dielectric layer 116.

The second gate dielectric layer 115 may not include the first element and the second element. In example embodiments, the second gate dielectric layer 115 may be formed of a dielectric material including any one of hafnium (Hf), titanium (Ti), zirconium (Zr), or praseodymium (Pr).

The gate spacer layers 119 may be disposed on both side surfaces of the first to fourth gate electrode layers GE1, GE2, GE3, and GE4. The gate spacer layers 119 may insulate the source/drain regions 170 and the first to fourth gate electrode layers GE1, GE2, GE3, and GE4. The gate spacer layers 119 may be formed to have a multi-layer structure according to embodiments. The gate spacer layers 119 may be made of an oxide, a nitride, or an oxynitride, and may be provided as a low dielectric constant film.

The first to fourth gate electrode layers GE1, GE2, GE3, and GE4 may be disposed to extend in one direction, for example, in the y direction, intersecting the active fins 105 on the active fins 105. The channel regions of the first to fourth transistors TR1, TR2, TR3, and TR4 may be formed in the active fins 105 intersecting the first to fourth gate electrode layers GE1, GE2, GE3, and GE4. The first to fourth gate electrode layers GE1, GE2, GE3, and GE4 may have first to fourth lengths L1, L2, L3, and LA, respectively, in a channel direction, e.g., in the x-direction. The first to fourth lengths L1, L2, L3, and L4 may be the same as or correspond to channel lengths of the first to fourth transistors TR1, TR2, TR3, and TR4. The first to fourth lengths L1, L2, L3, and L4 may be substantially the same as or may be similar to each other. For example, the first to fourth lengths L1, L2, L3, and L4 may each range from about 3 nm to about 50 nm.

The first gate electrode layer GE1 may include a first conductive layer 120, a second conductive layer **130*a*, a third conductive layer 142, and an upper conductive layer 144, sequentially stacked from the first gate dielectric layer 114. The second and third gate electrode layers GE2 and GE3 may include the second conductive layer 130*a*, the third conductive layer 142, and the upper conductive layer 144, sequentially stacked from the second and third gate dielectric layers 115 and 116, respectively. For example, the second and third gate electrode layers GE2 and GE3 may have substantially the same structure. The fourth gate electrode layer GE4 may include a fourth conductive layer 130*b*, the third conductive layer 142, and the upper conductive layer 144, sequentially stacked from the second gate dielectric layer 115. Relative thicknesses of the respective layers constituting the first to fourth gate electrode layers GE1, GE2, GE3, and GE4 are not limited to those illustrated in the drawings, and may be variously changed according to embodiments. As shown in FIGS. 2A and 2B, the respective layers constituting the gate electrode layers GE1, GE2, GE3, and GE4 may be directly on one another, and the gate electrode layers GE1, GE2, GE3, and GE4 may be directly on the gate dielectric layers 114, 115, 116, and 115**, respectively. As used herein, layers or elements described as "directly on" one another do not include intervening layers or elements therebetween.

The first conductive layer 120 may have a first work function, and may be, for example, a layer containing a metal element. The first conductive layer 120 may include a material having a lower work function than the second conductive layer **130*a* and the fourth conductive layer 130*b*, but is not limited thereto. The first conductive layer 120 may be a layer including the first element of the first gate dielectric layer 114, or may be a layer for providing the first element to the first gate dielectric layer 114**.

For example, the first conductive layer 120 may include an alloy, a conductive metal carbide, a conductive metal nitride, or a combination thereof, each including aluminum (Al), which may be the first element. In some embodiments, the first conductive layer 120 may include TiAl, TiAIC, TiAlN, or a combination thereof. Alternatively, the first conductive layer 120 may include an alloy, a conductive metal carbide, or a conductive metal nitride, or a combination thereof, each including at least one of tantalum (Ta), tungsten (W), manganese (Mn), chromium (Cr), ruthenium (Ru), platinum (Pt), gallium (Ga), germanium (Ge), or gold (Au), instead of aluminum (Al), as the first element. The first conductive layer 120 in the first gate electrode layer GE1 may be conformally disposed on the first gate dielectric layer 114.

The second conductive layer **130*a* and the fourth conductive layer 130*b* may have a second work function, higher than the first work function, and may be, for example, a layer containing a metal element. The second conductive layer 130*a* and the fourth conductive layer 130*b* may be made of the same material, and may be layers having different thicknesses. For example, the second conductive layer 130*a* and the fourth conductive layer 130*b* may include TiN, TaN, W, WCN, or a combination thereof. The second conductive layer 130*a* and the fourth conductive layer 130*b* may be layers that do not include the first element of the first gate dielectric layer 114**.

The second conductive layer **130*a* in the first gate electrode layer GE1 may be conformally disposed on the first conductive layer 120. In the second and third gate electrode layers GE2 and GE3, the second conductive layer 130*a* may be conformally disposed on the second and third gate dielectric layers 115 and 116, respectively. The fourth conductive layer 130***b* in the fourth gate electrode layer GE4 may be conformally disposed on the second gate dielectric layer 115.

A thickness T2 of the second conductive layer 130*a* may be greater than a thickness T1 of the first conductive layer 120. A thickness T3 of the fourth conductive layer 130*b* may be smaller or less than the thickness T2 of the second conductive layer 130*a*. The thickness T3 of the fourth conductive layer 130*b* may be greater than the thickness T1 of the first conductive layer 120, but is not limited thereto.

The third conductive layer 142 may have a third work function, lower than the second work function, and may be, for example, a layer containing a metal element. For example, the third conductive layer 142 may include an alloy, a conductive metal carbide, a conductive metal nitride, or a combination thereof, each containing aluminum (Al). In some embodiments, the third conductive layer 142 may include TiAl, TiAlC, TiAlN, or a combination thereof. In example embodiments, the third conductive layer 142 may include the same material as the first conductive layer 120, but is not limited thereto. For example, even when materials of the third conductive layer 142 and the first conductive layer 120 are the same, thicknesses thereof may be different. For example, a thickness of the third conductive layer 142 may be greater than the thickness of the first conductive layer 120.

In the first to third gate electrode layers GE1, GE2, and GE3, the third conductive layer 142 may be conformally disposed on the second conductive layer 130*a*. In the fourth gate electrode layer GE4, the third conductive layer 142 may be conformally disposed on the fourth conductive layer 130*b*.

The upper conductive layer 144 may include a different material from the third conductive layer 142, and may include, for example, TiN, TaN, W, WCN, or a combination thereof. In the first to fourth gate electrode layers GE1, GE2, GE3, and GE4, the upper conductive layer 144 may be disposed on the third conductive layer 142, and may completely fill a region between the third conductive layer 142 and the gate capping layer 150.

The gate capping layer 150 may be disposed on the first to fourth gate electrode layers GE1, GE2, GE3, and GE4 to fill a region between the gate spacer layers 119. The gate capping layer 150 may include at least one of an oxide, a nitride, or an oxynitride.

The interlayer insulating layer 190 may be disposed to cover the device isolation layers 107, the source/drain regions 170, and the first to fourth gate structures. The interlayer insulating layer 190 may include, for example, at least one of an oxide, a nitride, or an oxynitride, and may include a low dielectric constant material.

In the semiconductor device 100, all of the first to fourth transistors TR1, TR2, TR3, and TR4 may be MOSFETs of the same conductivity type, may have different threshold voltages, and may have thus different operating voltages. For example, when all of the first to fourth transistors TR1, TR2, TR3, and TR4 are p-type MOSFETs, the first transistor TR1 may have the lowest threshold and operating voltages, and the second transistor TR2 may have threshold and operating voltages that are higher than those of the first transistor TR1. Also, the third transistor TR3 may have threshold and operating voltages that are higher than those of the second transistor TR2, and the fourth transistor TR4 may have threshold and operating voltages that are higher than those of the third transistor TR3. In this specification, magnitudes of the threshold and operating voltages may be compared as absolute values thereof.

Differences in threshold and operating voltages between the first to fourth transistors TR1, TR2, TR3, and TR4 may be due to a difference in material of the first to third gate dielectric layers 114, 115, and 116, and/or may be due to a difference in structure of the first to fourth gate electrode layers GE1, GE2, GE3, and GE4.

In an embodiment in which the first conductive layer 120 and the third conductive layer 142 are made of TiAIC, and the second conductive layer 130*a* is made of TiN, a threshold voltage of the first transistor TR1 may be reduced by about 30 mV to about 86 mV, as compared to the second transistor TR2. The above range may be due to differences in process conditions. This may be interpreted that, as the first element in the first conductive layer 120 diffuses into the first gate dielectric layer 114 and changes an interface between the first gate dielectric layer 114 and the first gate electrode layer GE1, a threshold voltage of the p-type MOSFET is reduced.

In example embodiments, the semiconductor device 100 may further include a fifth transistor including the third gate dielectric layer 116 and the fourth gate electrode layer GE4. In example embodiments, the semiconductor device 100 may further include a sixth transistor including the first gate dielectric layer 114, the first conductive layer 120, and the fourth gate electrode layer GE4. In this case, with the same principle as in the first to third transistors TR1, TR2, and TR3, the fifth transistor may have threshold and operating voltages that are higher than those of the fourth transistor TR4. The sixth transistor may have threshold and operating voltages that are lower than those of the fourth transistor TR4.

In example embodiments, the semiconductor device 100 may include transistors having various channel lengths. Also, transistors having the same channel lengths and having the same gate structures as the first to fourth transistors TR1, TR2, TR3, and TR4, respectively, may have different threshold and operating voltages.

Further, in example embodiments, the semiconductor device 100 may not include at least one of the second to fourth transistors TR2, TR3, and TR4. For example, the semiconductor device 100 may include only the first, second, and fourth transistors TR1, TR2, and TR4, or may include only the first and third transistors TR1 and TR3. As such, types of transistors included in the semiconductor device 100 may be variously selected, depending on ranges of operating voltages desired or required in the semiconductor device 100.

Figure 3:
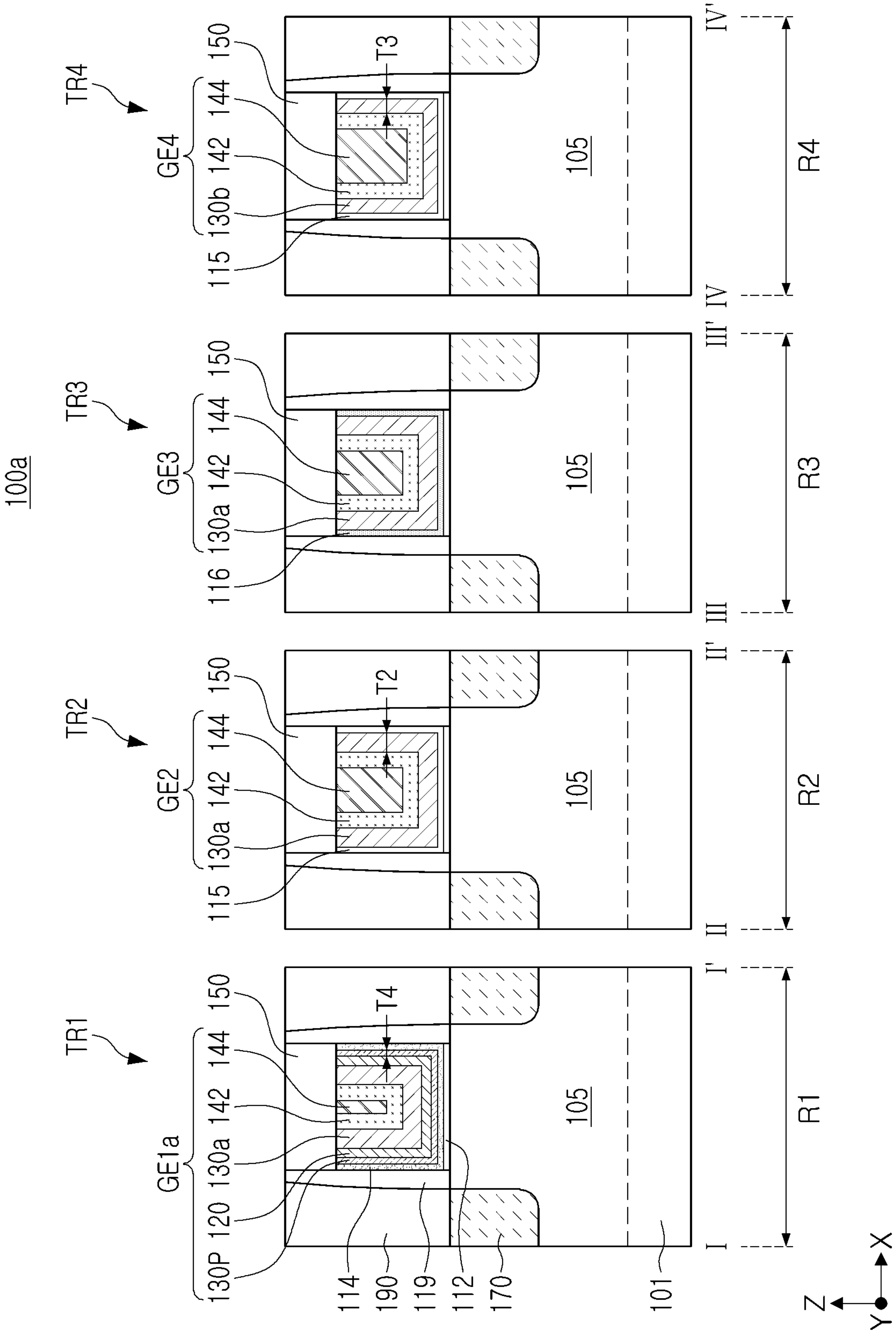
FIG. 3 is a cross-sectional view illustrating a semiconductor device according to example embodiments.

FIG. 3 is a cross-sectional view illustrating a semiconductor device according to example embodiments.

Referring to FIG. 3, in a semiconductor device 100*a*, a structure of a first gate electrode layer GE1*a* of a first transistor TR1 disposed in a first region R1 may be different from that of the embodiments of FIGS. 2A and 2B.

The first gate electrode layer GE1*a* includes a lower conductive layer 130P, a first conductive layer 120, a second conductive layer 130*a*, a third conductive layer 142, and an upper conductive layer 144, sequentially stacked from a first gate dielectric layer 114. In contrast to the first gate electrode layer GE1 of FIGS. 2A and 2B, the first gate electrode layer GE1*a* may further include the lower conductive layer 130P, disposed in a lowermost portion in the first gate electrode layer GE1*a*.

The lower conductive layer 130P may have a work function higher than a work function of the first conductive layer 120, and may be, for example, a layer containing a metal element. For example, the lower conductive layer 130P may include TiN, TaN, W, WCN, or a combination thereof. For example, the lower conductive layer 130P may be made of the same material as the second conductive layer 130*a* and/or the fourth conductive layer 130*b*. Even in this case, the lower conductive layer 130P may be a layer on which a heat treatment process is performed, and may have thus crystallinity and physical properties, slightly different from the second conductive layer 130*a* and the fourth conductive layer 130*b*.

The lower conductive layer 130P in the first gate electrode layer GE1*a* may be conformally disposed on the first gate dielectric layer 114. A thickness T4 of the lower conductive layer 130P may be less than a thickness T2 of the second conductive layer 130*a* and a thickness T3 of the fourth conductive layer 130*b*. For example, the thickness T4 of the lower conductive layer 130P may range from about 2 Angstroms (Å) to about 10 Å. When the thickness T4 of the lower conductive layer 130P is less than a thickness having the above range, it may be difficult to be conformally formed. When the thickness of the lower conductive layer 130P is greater than the above range, diffusion of a first element in the first conductive layer 120 into the first gate dielectric layer 114 may be more difficult.

In example embodiments, at least one of second to fourth gate electrode layers GE2, GE3, and GE4 of second to fourth transistors TR2, TR3, and TR4 may further include the lower conductive layer 130P, disposed in a lowermost portion in the respective gate electrode layer. In this case, a thickness of the lower conductive layer 130P of at least one of the second to fourth gate electrode layers GE2, GE3, and GE4 may be the same as or greater than the thickness T4 of the lower conductive layer 130P of the first gate electrode layer GE1*a*.

Figure 4A:
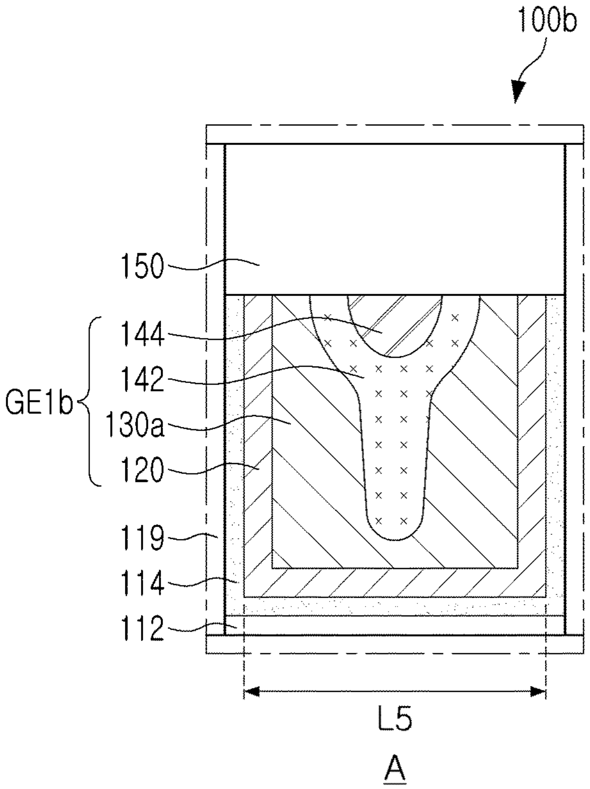
FIGS. 4A to 4C are partially enlarged views illustrating a portion of a semiconductor device according to example embodiments.
Figure 4B:
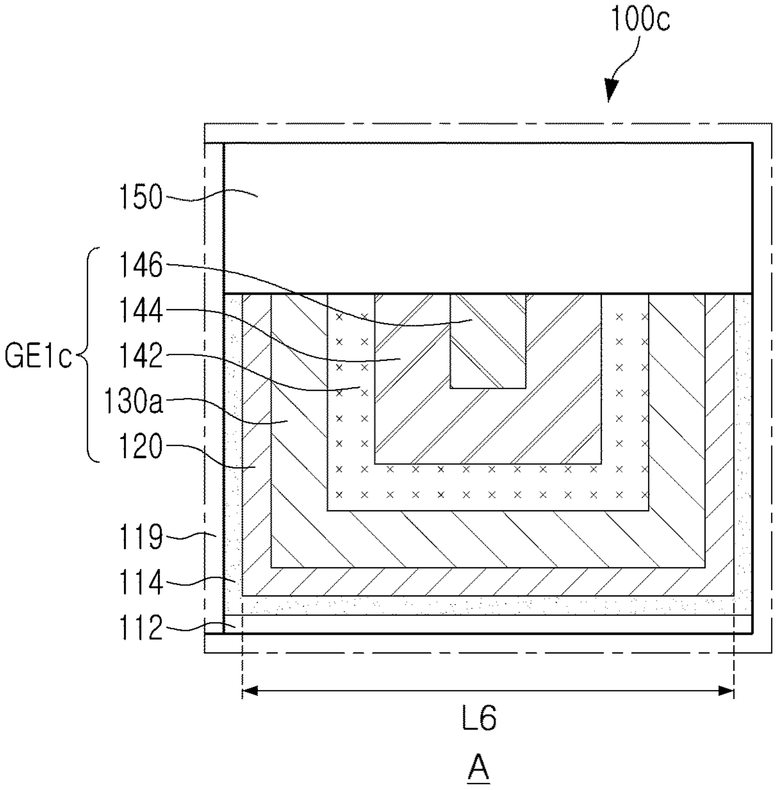
Figure 4C:
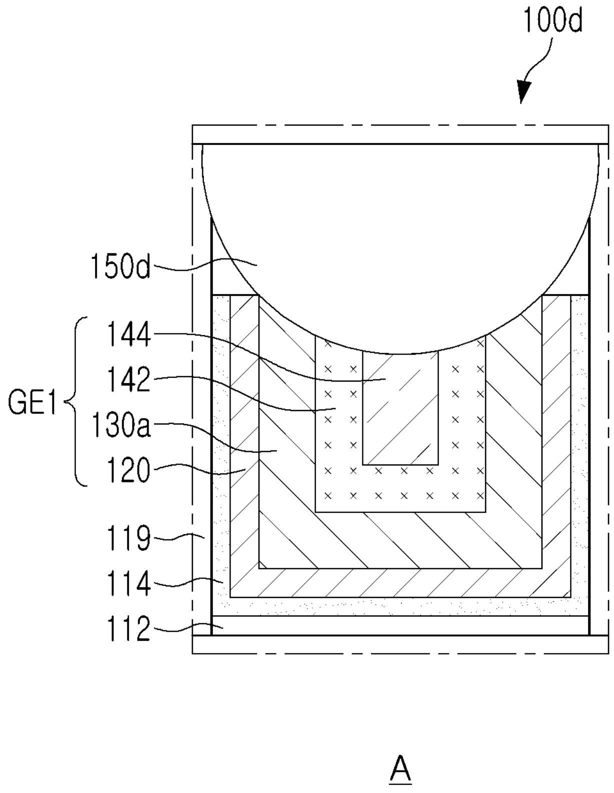

FIGS. 4A to 4C are partially enlarged views illustrating a portion of a semiconductor device according to example embodiments. FIGS. 4A to 4C illustrate an enlarged view of a region, corresponding to the portion A of FIG. 2A.

Referring to FIG. 4A, in a first gate electrode layer GE1*b* of a semiconductor device 100*b*, shapes of a second conductive layer 130*a*, a third conductive layer 142, and an upper conductive layer 144 may be different from the embodiment illustrated in FIG. 2A.

The second conductive layer 130*a* may be disposed on a first conductive layer 120, may be disposed in a U-shape or a similar shape to have a curved upper surface, and may have a vertically elongated and concave region in a central portion, as illustrated. The second conductive layer 130*a* may be configured such that a predetermined region in an upper portion of the second conductive layer 130*a* has a thickness less than in a lower portion of the second conductive layer 130*a*. In this case, the thickness may refer to a thickness from a side surface of a first gate dielectric layer 114 (i.e., the portion of the first gate dielectric layer 114 that is vertically extended). That is, the thickness of the regions of the second conductive layer 130*a* may refer to a dimension along the x-direction shown in FIG. 2A, i.e., along the same direction as the illustrated thicknesses T1, T2, and T3.

The third conductive layer 142 may be disposed on the second conductive layer 130*a*, and may have a curved upper surface having a concave region. The third conductive layer 142 may be conformally formed along the second conductive layer 130*a*. In a lower region of the second conductive layer 130*a* having a relatively narrow space, the third conductive layer 142 may be configured to fill a space surrounded by the second conductive layer 130*a*. Therefore, the third conductive layer 142 may have a Y-shape or a similar shape. The third conductive layer 142 may have a shape in which a full width of the upper portion is wider than a full width of the lower portion. In this case, the full width may refer to a distance from one end to the other end in the x-direction, and, in a case of an upper region of the third conductive layer 142, may refer to a distance between both ends of the upper region of the third conductive layer 142 with the upper conductive layer 144 interposed therebetween.

The upper conductive layer 144 may entirely fill a concave region surrounded by the third conductive layer 142. The upper conductive layer 144 may have a planar upper surface contacting a gate capping layer 150. The upper conductive layer 144 may be configured that a lower portion has a narrower width than an upper portion. According to embodiments, the third conductive layer 142 may not completely fill the space surrounded by the second conductive layers 130*a*, and accordingly, the upper conductive layer 144 may have a region extending partially to a lower portion in a central portion.

The shapes of the second conductive layer 130*a*, the third conductive layer 142, and the upper conductive layer 144 described with reference to the first gate electrode layer GE1*b* may be similarly applicable to at least a portion of second to fourth gate electrode layers GE2, GE3, and GE4. Such shapes may be applicable, for example, in a case that a length L5 of the first gate electrode layer GE1*b* is shorter than the length L1 in the embodiment of FIG. 2A, or in a case that a thickness of at least a portion of layers constituting the first gate electrode layer GE1*b* is relatively thick.

Referring to FIG. 4B, in contrast to the embodiment of FIG. 2A, a first gate electrode layer GE1*c* of a semiconductor device 100*c* may further include an uppermost conductive layer 146, disposed in an uppermost portion in the first gate electrode layer GE1*c*.

The uppermost conductive layer 146 may be disposed to fill a space surrounded by an upper conductive layer 144. The uppermost conductive layer 146 may include a different material from the upper conductive layer 144, and may include, for example, TiN, TaN, W, WCN, or a combination thereof. The uppermost conductive layer 146 may not necessarily be made of a metal material, and may be made of a semiconductor material such as polysilicon, according to embodiments.

The structure of the first gate electrode layer GE1*c* may be applied to at least a portion of second to fourth gate electrode layers GE2, GE3, and GE4. The structure may be applicable, for example, in a case that a length L6 of the first gate electrode layer GE1*c* is longer than the length L1 in the embodiment of FIG. 2A, and/or in a case that a thickness of at least a portion of layers constituting the first gate electrode layer GE1*c* is relatively thin. In example embodiments, the number of conductive layers disposed on the upper conductive layer 144 may be variously changed, e.g., with fewer or more layers than shown in FIG. 4B.

Referring to FIG. 4C, in a semiconductor device 100*d*, a gate capping layer 150*d* may have a convex curved lower surface. Therefore, a first gate electrode layer GE1 may also have a curved upper surface. The gate capping layer 150*d* may be disposed to partially recess gate spacer layers 119. As such, in example embodiments, a shape, a width, and a depth of the gate capping layer 150*d* may be variously changed.

Figure 5:
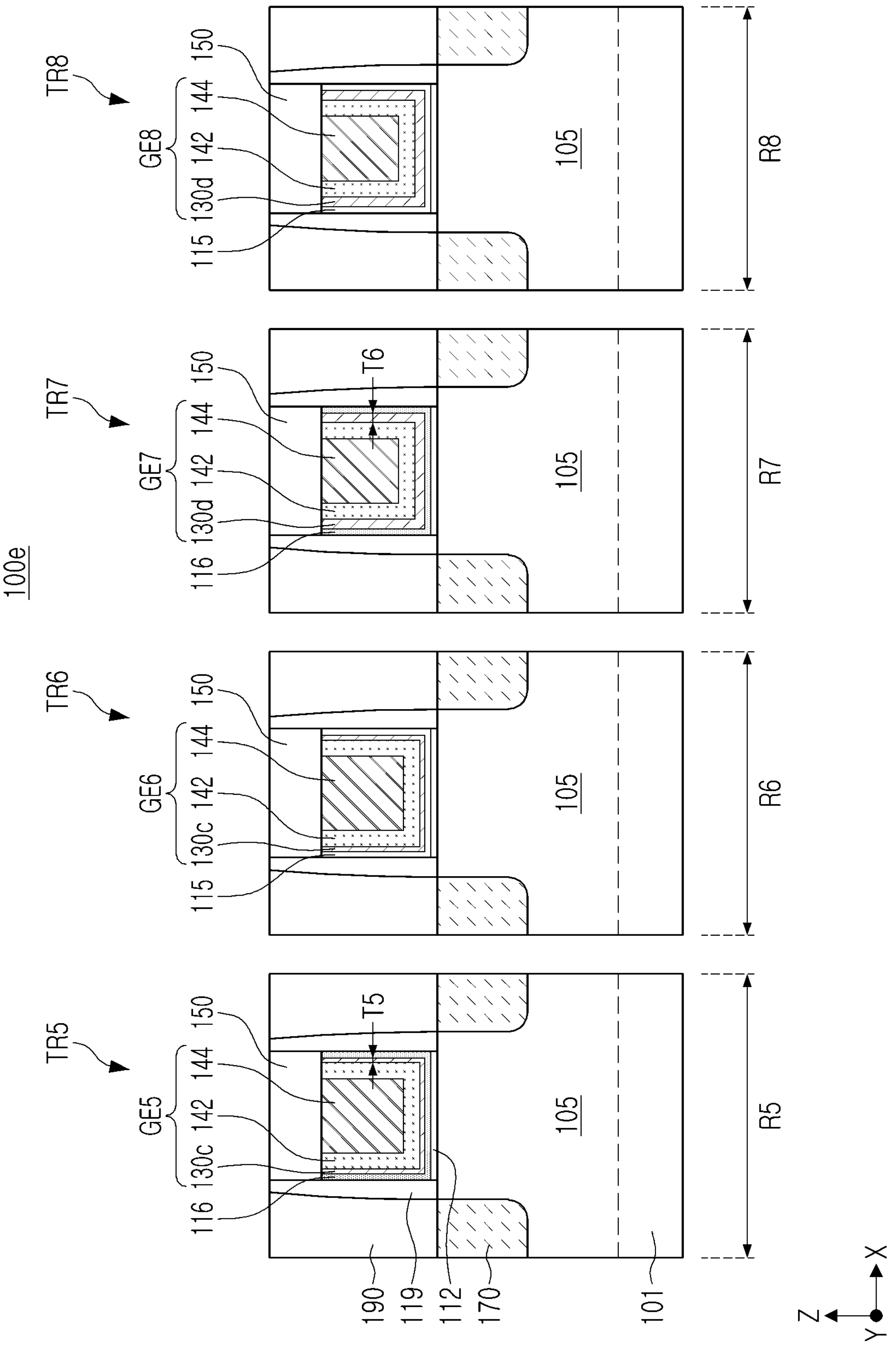
FIG. 5 is a cross-sectional view illustrating a semiconductor device according to example embodiments.

FIG. 5 is a cross-sectional view illustrating a semiconductor device according to example embodiments.

Referring to FIG. 5, a semiconductor device 100*e* may include a substrate 101 having fifth to eighth regions R5, R6, R7, and R8, active fins 105, source/drain regions 170, interface layers 112, second and third gate dielectric layers 115 and 116, gate spacer layers 119, and fifth to eighth gate electrode layers GE5, GE6, GE7, and GE8. The semiconductor device 100*e* may further include device isolation layers 107, a gate capping layer 150, and an interlayer insulating layer 190. Hereinafter, descriptions overlapping or repeating the above-described description with reference to FIGS. 1 to 2B will be omitted.

The semiconductor device 100*e* may include fifth to eighth transistors TR5, TR6, TR7, and TR8 disposed around the active fins 105 and the fifth to eighth gate electrode layers GE5, GE6, GE7, and GE8, intersecting each other. For example, all of the fifth to eighth transistors TR5, TR6, TR7, and TR8 may be n-type MOSFETs. Therefore, the active fins 105 may include p-type impurities. The fifth to eighth transistors TR5, TR6, TR7, and TR8 may be transistors that are configured to operate under or responsive to different threshold voltages. In example embodiments, the semiconductor devices 100, 100*a*, 100*b*, 100*c*, and 100*d* described above with reference to FIGS. 1 to 4 may further include at least one of the fifth to eighth transistors TR5, TR6, TR7, and TR8 of the semiconductor device 100*c*.

The fifth transistor TR5 may include the third gate dielectric layer 116 and the fifth gate electrode layer GE5, and the sixth transistor TR6 may include the second gate dielectric layer 115 and the sixth gate electrode layer GE6. The seventh transistor TR7 may include the third gate dielectric layer 116 and the seventh gate electrode layer GE7, and the eighth transistor TR8 may include the second gate dielectric layer 115 and the eighth gate electrode layer GE8. The fifth to eighth gate electrode layers GE5, GE6, GE7, and GE8 may have substantially the same length in a channel direction, e.g., in the x-direction. The length may be substantially the same as or similar to the first to fourth lengths L1, L2, L3, and L4 of FIG. 1.

The fifth gate electrode layer GE5 may include a fifth conductive layer 130*c*, a third conductive layer 142, and an upper conductive layer 144, sequentially stacked from the third gate dielectric layer 116. The sixth gate electrode layer GE6 may include the fifth conductive layer 130*c*, the third conductive layer 142, and the upper conductive layer 144, sequentially stacked from the second gate dielectric layer 115. For example, the fifth and sixth gate electrode layers GE5 and GE6 may have substantially the same structure. The seventh gate electrode layer GE7 may include a sixth conductive layer 130*d*, the third conductive layer 142, and the upper conductive layer 144, sequentially stacked from the third gate dielectric layer 116. The eighth gate electrode layer GE8 may include the sixth conductive layer 130*d*, the third conductive layer 142, and the upper conductive layer 144, sequentially stacked from the second gate dielectric layer 115. For example, the seventh and eighth gate electrode layers GE7 and GE8 may have substantially the same structure.

The fifth conductive layer 130*c* and the sixth conductive layer 130*d* may have a second work function, higher than the first work function of the first conductive layer 120 of the embodiment of FIG. 2B, and may be a layer containing, for example, a metal element. The fifth conductive layer 130*c* and the sixth conductive layer 130*d* may be made of the same material, and may have different thicknesses. The fifth conductive layer 130*c* and the sixth conductive layer 130*d* may be layers made of the same material as the second conductive layer 130*a* and the fourth conductive layer 130*b* of the embodiment of FIG. 2B and may have different thicknesses. For example, the fifth conductive layer 130*c* and the sixth conductive layer 130*d* may include TIN, TaN, W, WCN, or a combination thereof.

The fifth conductive layer 130*c* and the sixth conductive layer 130*d* may be conformally disposed on the second and third gate dielectric layers 115 and 116. A thickness T5 of the fifth conductive layer 130*c* may be less than a thickness T6 of the sixth conductive layer 130*d*. The thickness T6 of the sixth conductive layer 130*d* may be less than the thickness T3 of the fourth conductive layer 130*b* of FIG. 2B.

The fifth to eighth transistors TR5, TR6, TR7, and TR8 may have different threshold voltages, and may have thus different operating voltages. The fifth transistor TR5 may have the lowest threshold and operating voltages, and the sixth transistor TR6 may have a higher threshold and operating voltages than the fifth transistor TR5. Also, the seventh transistor TR7 may have threshold and operating voltages higher than those of the sixth transistor TR6, and the eighth transistor TR8 may have threshold and operating voltages higher than those of the seventh transistor TR7. Differences in threshold and operating voltages between the fifth to eighth transistors TR5, TR6, TR7, and TR8 may be due to a difference in structure of the fifth to eighth gate electrode layers GE5, GE6, GE7, and GE8, and/or may be due to a difference in material of the second and third gate dielectric layers 115 and 116.

Figure 6:
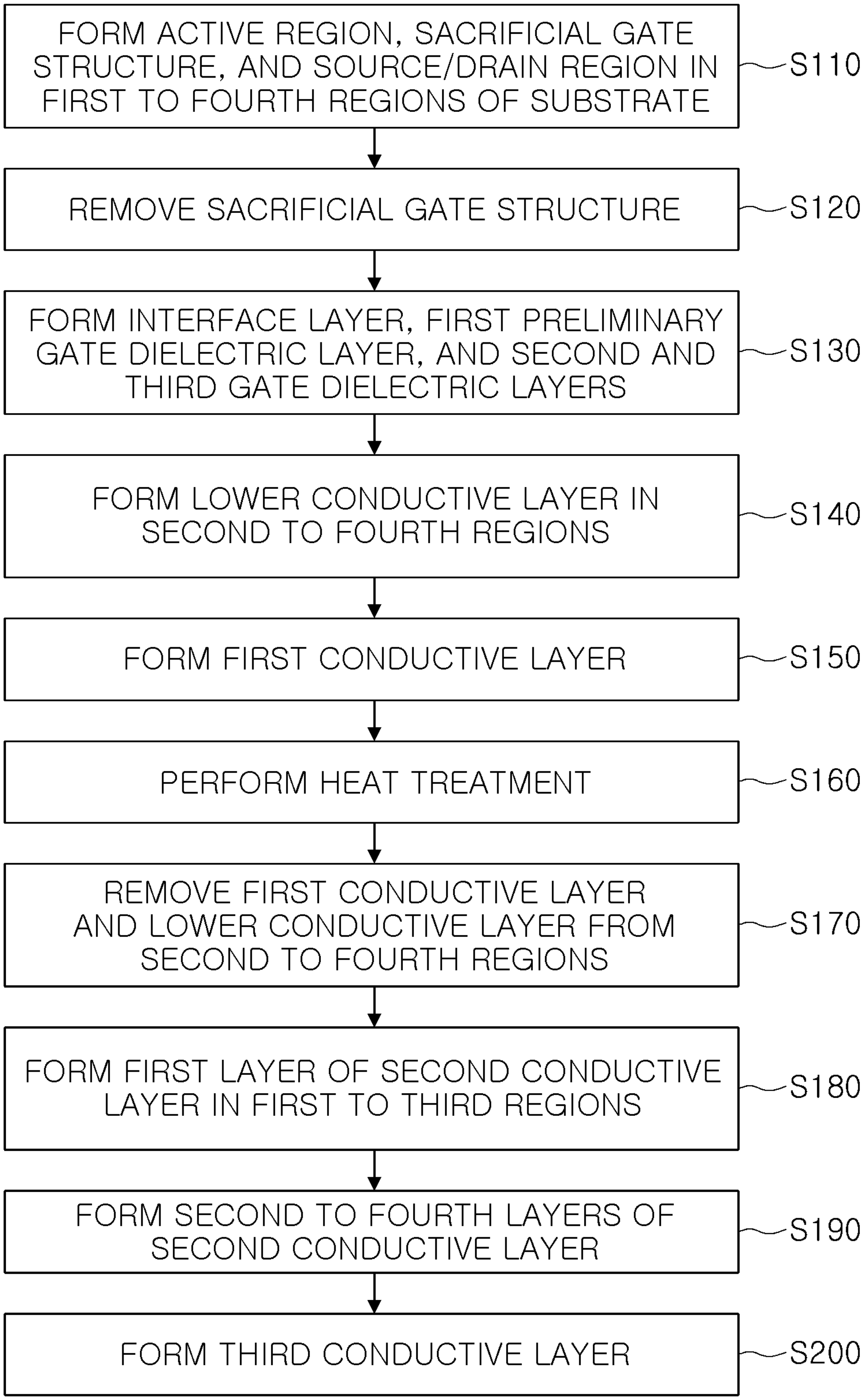
FIG. 6 is a flow chart illustrating a method of manufacturing a semiconductor device according to example embodiments.

FIG. 6 is a flow chart illustrating a method of manufacturing a semiconductor device according to example embodiments.

FIGS. 7A to 7K are diagrams according to a process sequence, illustrating a method of manufacturing a semiconductor device according to example embodiments.

Figure 7A:
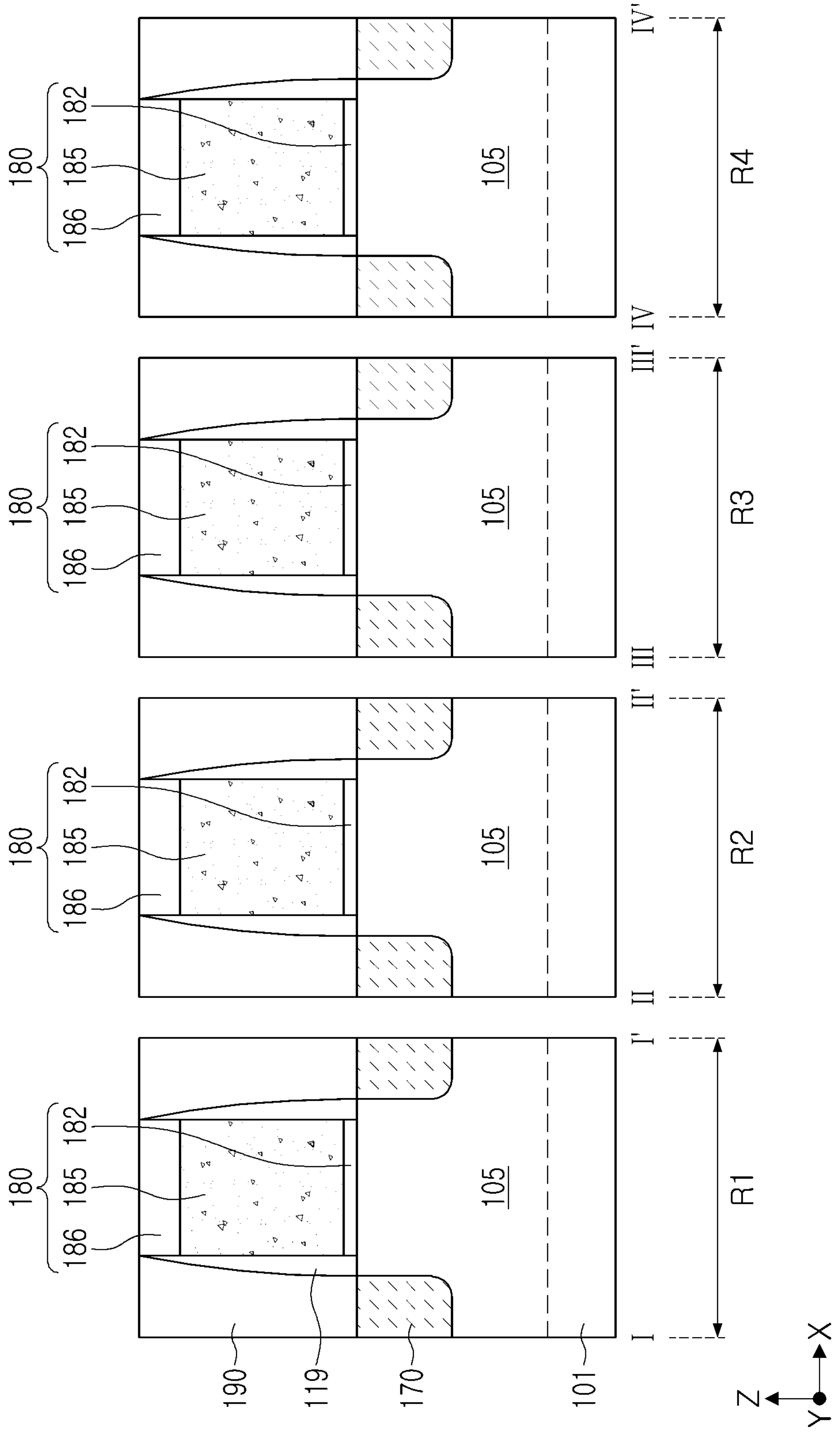
FIGS. 7A to 7K are diagrams according to a process sequence, illustrating a method of manufacturing a semiconductor device according to example embodiments.

Referring to FIGS. 6 and 7A, a substrate 101 having first to fourth regions R1, R2, R3, and R4 may be patterned to form active fins 105, which may be active regions, and sacrificial gate structures 180 and source/drain regions 170 may be formed (S110). In addition, in this operation, gate spacer layers 119 and an interlayer insulating layer 190 may also be formed.

The first to fourth regions R1, R2, R3, and R4 may be p-type MOSFET regions, and the substrate 101 may include conductive regions, for example, well structures doped with impurities. The active fins 105 may be defined by forming device isolation layers 107 (see FIG. 2B), and may have a shape protruding from the substrate 101. The active fins 105 may include impurity regions, and may include, for example, n-type impurity regions.

The sacrificial gate structures 180 may be formed in a region in which the interface layers 112, the first to third gate dielectric layers 114, 115, and 116, and the first to fourth gate electrode layers GE1, GE2, GE3, and GE4 are to be arranged, as illustrated in FIG. 2A, by a subsequent process. The sacrificial gate structure 180 may include a sacrificial gate insulating layer 182, a sacrificial gate electrode layer 185, and a sacrificial gate capping layer 186. The sacrificial gate insulating layer 182 and the sacrificial gate capping layer 186 may be insulating layers, and the sacrificial gate electrode layer 185 may be a conductive layer, but are not limited thereto. For example, the sacrificial gate insulating layer 182 may include silicon oxide, the sacrificial gate electrode layer 185 may include polysilicon, and the sacrificial gate capping layer 186 may include at least one of silicon oxide, silicon nitride, or silicon oxynitride.

The gate spacer layers 119 may be formed on both side walls of the sacrificial gate structure 180. The gate spacer layers 119 may be made of a low-k material, and may include at least one of SiO, SiN, SiCN, SiOC, SiON, or SiOCN.

The source/drain regions 170 may be formed on recessed active fins 105 after removing a portion of the active fins 105 on both sides of the gate spacer layers 119. The source/drain regions 170 may be formed using, for example, a selective epitaxial growth (SEG) process. The source/drain regions 170 may include a semiconductor material doped with impurities, for example, Si, SiGe, or SiC. In particular, the source/drain regions 170 may include p-type impurities. The impurities may be doped in-situ during formation of source/drain regions 170, or may be injected separately after growth of the source/drain regions 170. The source/drain regions 170 may be grown along a crystallographically stable surface during the growth process, such that a cross-section in a direction not illustrated has a pentagonal shape, a hexagonal shape, or similar shape, but is not limited thereto.

The interlayer insulating layer 190 may be formed by depositing an insulating material to cover the sacrificial gate structures 180 and the source/drain regions 170, and exposing the upper surfaces of the sacrificial gate structures 180 by a planarization process. The interlayer insulating layer 190 may include, for example, at least one of oxide, nitride, and oxynitride, and may include a low-k material.

Figure 7B:
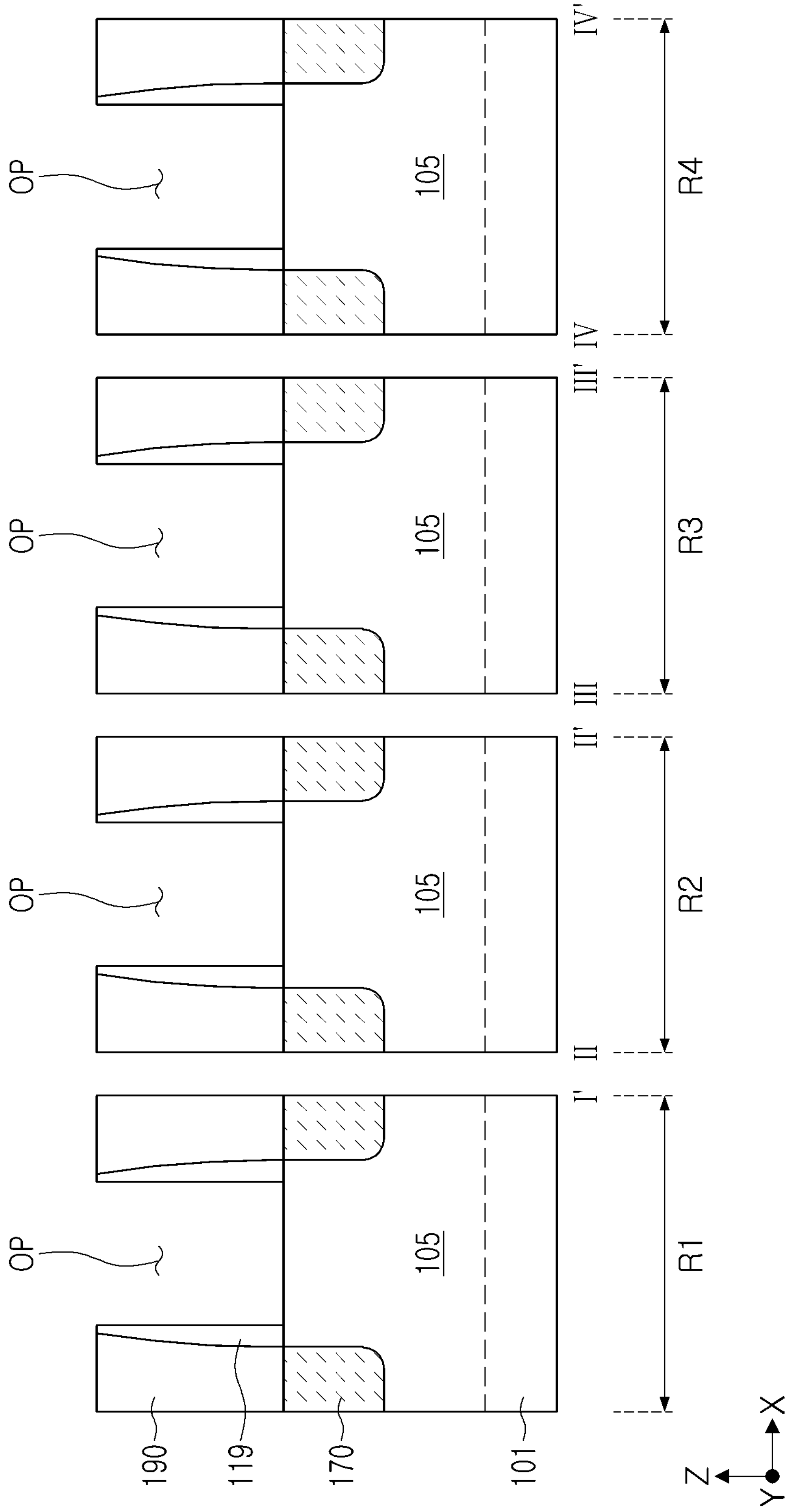

Referring to FIGS. 6 and 7B, the sacrificial gate structures 180 may be removed to form openings OP (S120).

The sacrificial gate structures 180 may be selectively removed with respect to the device isolation layers 107 and the active fins 105 to form the openings OP exposing the device isolation layers 107, the active fins 105, and the gate spacer layers 119. The removal operation of the sacrificial gate structure 180 may use at least one of a dry etching process and a wet etching process.

Figure 7C:
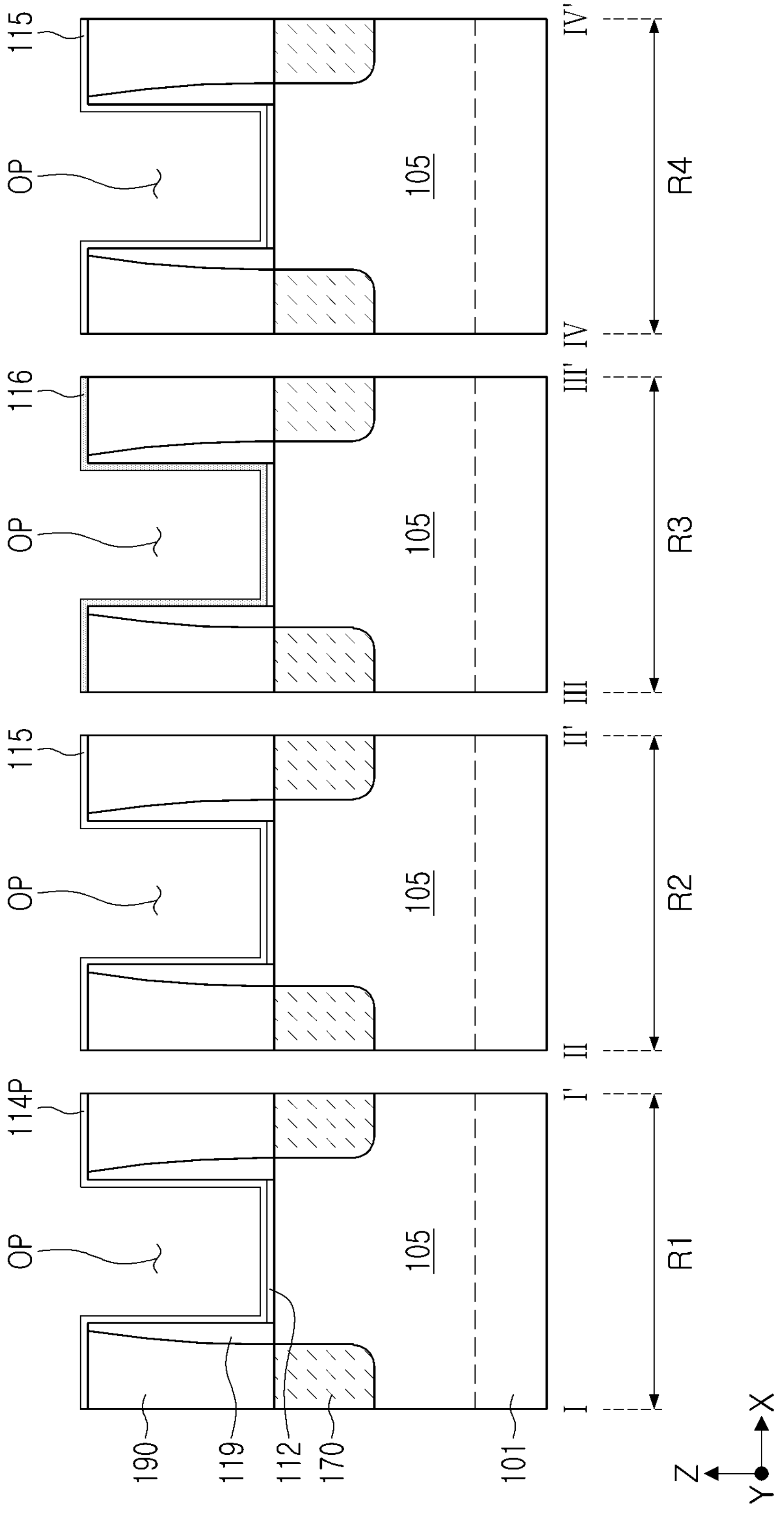

Referring to FIGS. 6 and 7C, an interface layer 112, a first preliminary gate dielectric layer 114P, and second and third gate dielectric layers 115 and 116 may be formed in the openings OP (S130).

The interface layer 112 may be formed to have substantially the same thickness in the first to fourth regions R1, R2, R3, and R4. The interface layer 112 may be formed on upper surfaces of the active fins 105 exposed to lower surfaces of the openings OP. According to some embodiments, the interface layer 112 may be formed by oxidizing a portion of the active fins 105.

The first preliminary gate dielectric layer 114P and the second and third gate dielectric layers 115 and 116 may be formed to have substantially the same thickness in the first to fourth regions R1, R2, R3, and R4. The first preliminary gate dielectric layer 114P and the second and third gate dielectric layers 115 and 116 may be formed substantially conformally along side walls and lower surfaces of the opening OP. In this operation, the first preliminary gate dielectric layer 114P may be formed of the same material as a dielectric material constituting the second gate dielectric layer 115. The third gate dielectric layer 116 may be formed by depositing the dielectric material constituting the second gate dielectric layer 115 and then injecting or otherwise introducing a second element by a separate process.

The interface layer 112, the first preliminary gate dielectric layer 114P, and the second and third gate dielectric layers 115 and 116 may be formed using a atomic layer deposition (ALD) process, a chemical vapor deposition (CVD) process, or a physical vapor deposition (PVD) process. The first preliminary gate dielectric layer 114P and the second and third gate dielectric layers 115 and 116 may include an oxide, a nitride, or a high-k material. For example, the first preliminary gate dielectric layer 114P and the second gate dielectric layer 115 may include hafnium oxide ($HfO_2$), and the third gate dielectric layer 116 may include lanthanum hafnium oxide ($LaHf_xO_y$).

Figure 7D:
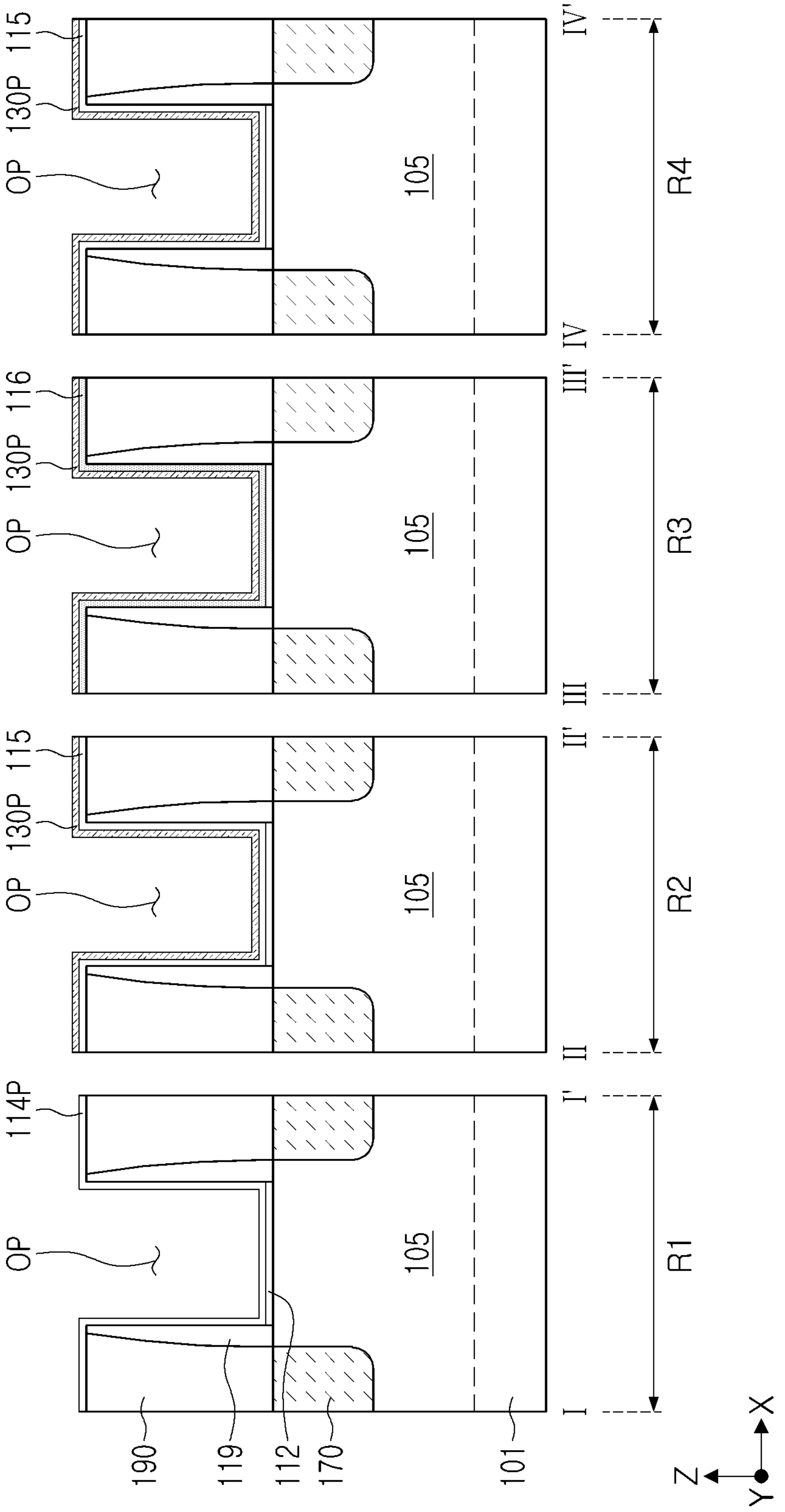

Referring to FIGS. 6 and 7D, lower conductive layers 130P may be formed in the openings OP in the second to fourth regions R2, R3, and R4 (S140).

The lower conductive layers 130P may remain only in the second to fourth regions R2, R3, and R4, for example, by being deposited on the entire substrate 101 and being selectively removed from the first region R1. The lower conductive layer 130P may prevent re-growth of the first preliminary gate dielectric layer 114P and the second and third gate dielectric layers 115 and 116 during a subsequent heat treatment operation.

The lower conductive layer 130P may be made of the same material as a second conductive layer 130*a* and/or a fourth conductive layer 130*b*, to be formed later, but is not limited thereto. For example, the lower conductive layer 130P may include TiN, TaN, W, WCN, or a combination thereof. The lower conductive layer 130P may have a thickness in a range of about 10 Å to about 20 Å, for example.

In the case of the embodiment of FIG. 3, after forming the lower conductive layer 130P in the first to fourth regions R1, R2, R3, and R4 in a relatively thin thickness in this operation, the semiconductor device 100*a* may be manufactured by removing a first conductive layer 120 in the second to fourth regions R2, R3, and R4 before the heat treatment to be described with reference to FIG. 7F below. Alternatively, semiconductor device 100*a* may be manufactured by forming the lower conductive layer 130P in a relatively thin thickness in the first region R1, in this operation.

Figure 7E:
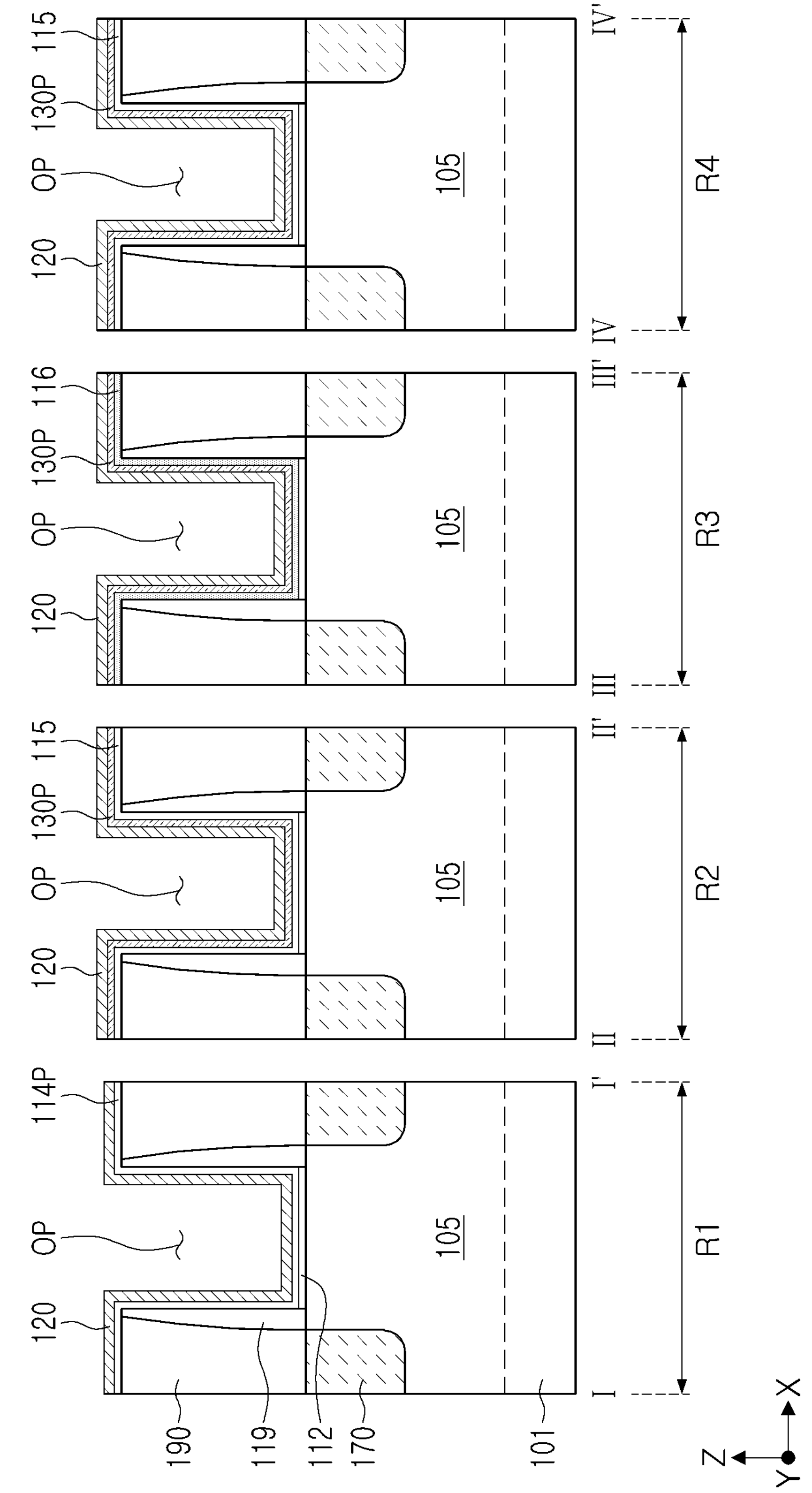

Referring to FIGS. 6 and 7E, first conductive layers 120 may be formed in the openings OP (S150).

The first conductive layers 120 may be formed in each of the first to fourth regions R1, R2, R3, and R4. The first conductive layers 120 may be layers containing a first element that is to be ultimately included in a first gate dielectric layer 114. The first element may include at least one of aluminum (Al), tantalum (Ta), tungsten (W), manganese (Mn), chromium (Cr), ruthenium (Ru), platinum (Pt), gallium (Ga), germanium (Ge), or gold (Au). The first conductive layers 120 may have a thickness in a range of about 10 Å to about 20 Å, for example.

Figure 7F:
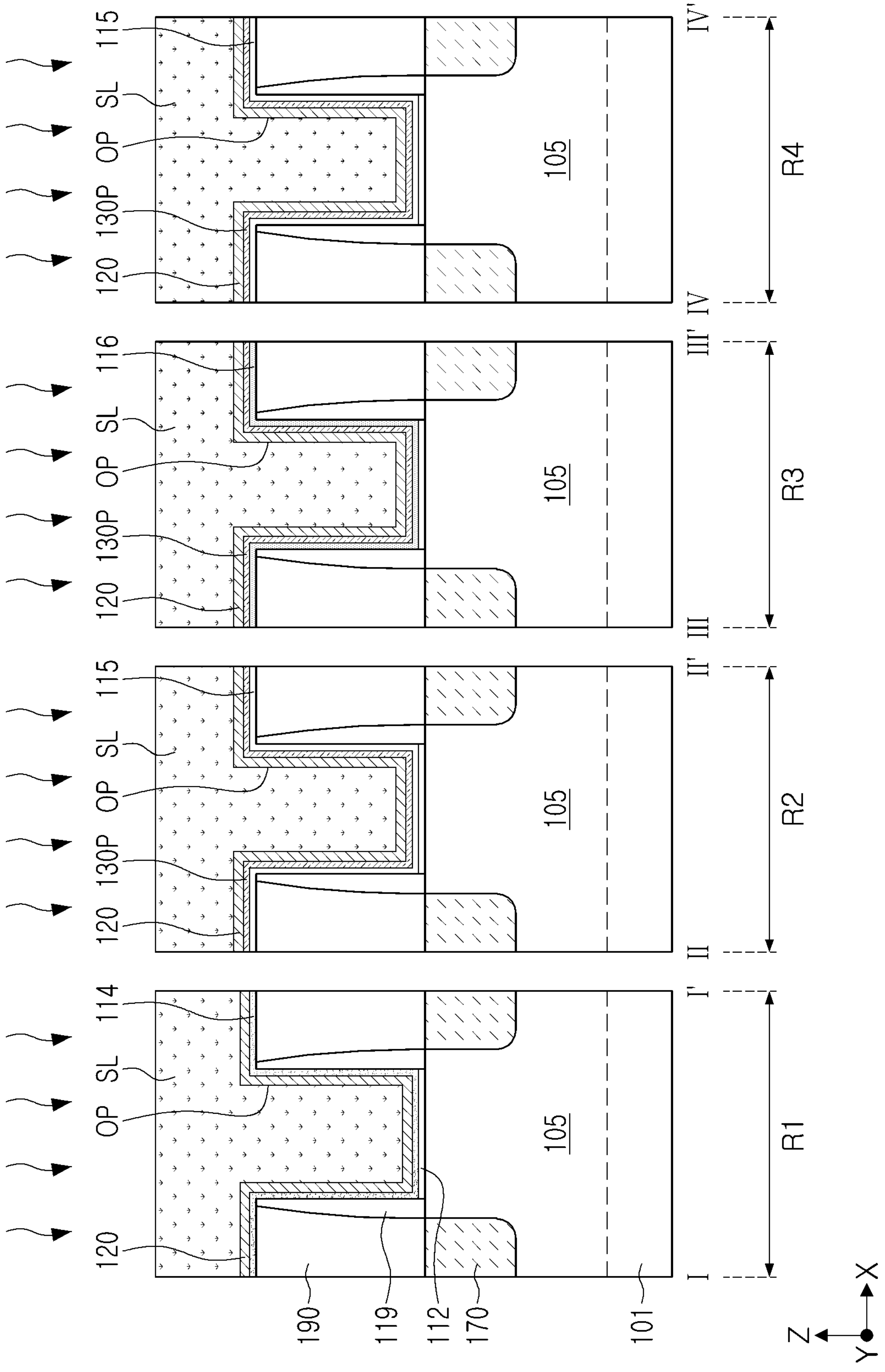

Referring to FIGS. 6 and 7F, after forming sacrificial layers SL for heat treatment, a heat treatment may be performed (S160).

The sacrificial layers SL for heat treatment may be formed in each of the first to fourth regions R1, R2, R3, and R4. The sacrificial layers SL for heat treatment may be formed of, for example, polysilicon. The sacrificial layers SL for heat treatment may be formed and the heat treatment may be performed, to prevent re-growth of the interface layer 112 and the like, and to remove vacancy or vacancies from the first preliminary gate dielectric layer 114P and the second and third gate dielectric layers 115 and 116 by the heat treatment operation.

The heat treatment may be performed, for example, at a temperature of about 800° C. to 1000° C. By the heat treatment operation, the first element in the first conductive layer 120 may be diffused into the first preliminary gate dielectric layer 114P in the first region R1. Therefore, the first preliminary gate dielectric layer 114P may be provided as a first gate dielectric layer 114 including the first element. In the case of the second to fourth regions R2, R3, and R4, due to the lower conductive layer 130P, the first element in the first conductive layer 120 may not be diffused into the second and third gate dielectric layers 115 and 116. Therefore, in the process of forming the lower conductive layer 130P described above with reference to FIG. 7D, the thickness of the lower conductive layer 130P may be selected within a range that may prevent diffusion of the first element in consideration of a heat treatment temperature, a type of the first element, or the like.

Figure 7G:
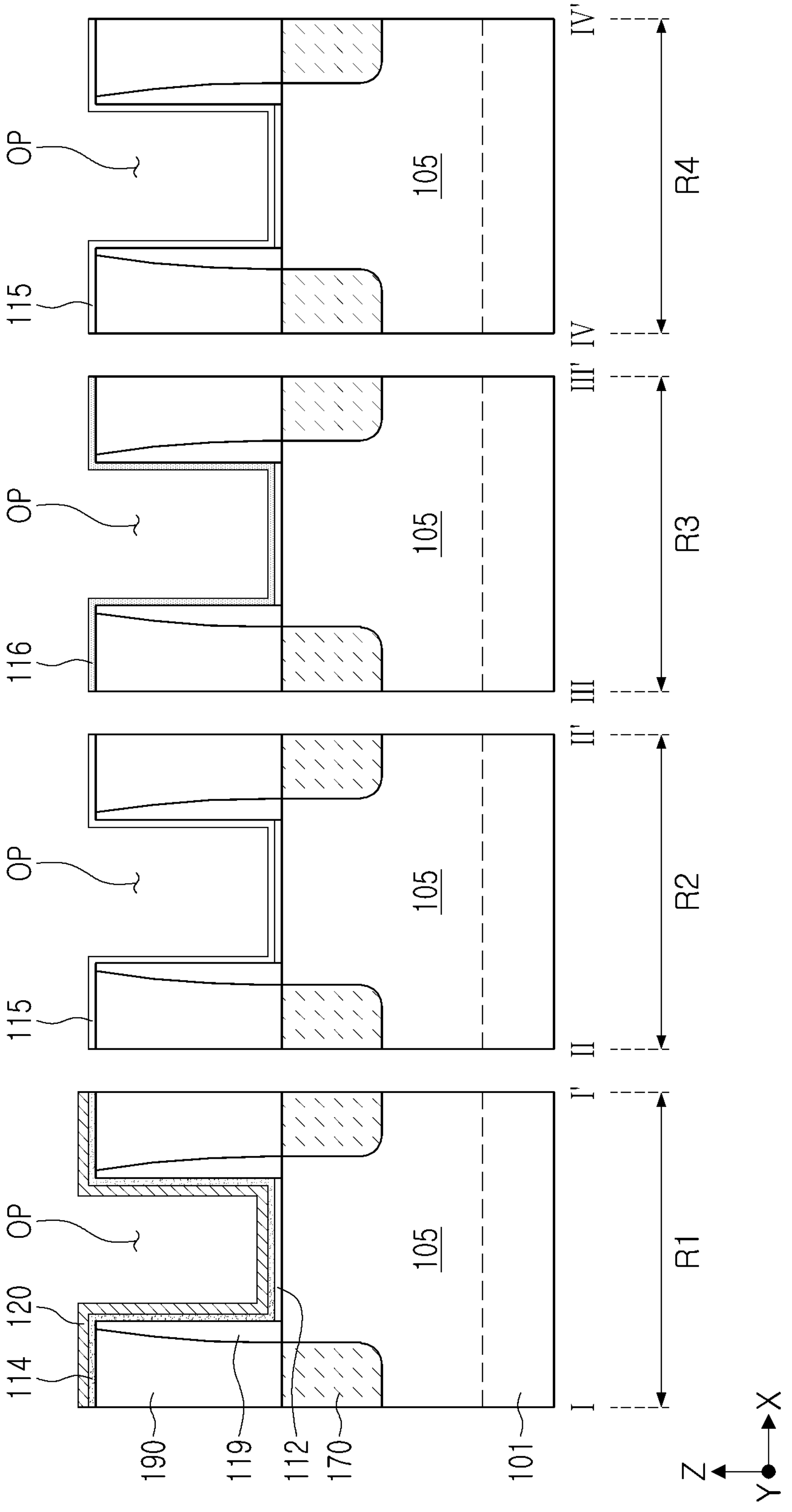

Referring to FIGS. 6 and 7G, after removing the sacrificial layers SL for heat treatment, the first conductive layers 120 and the lower conductive layers 130P may be removed from the second to fourth regions R2, R3, and R4 (S170).

The sacrificial layers SL for heat treatment may be selectively removed with respect to the first conductive layer 120 by, for example, a wet etching process. The first conductive layers 120 and the lower conductive layers 130P may be removed only from the second to fourth regions R2, R3, and R4, after forming a separate mask layer on the first region R1. Therefore, the first conductive layer 120 may remain in the first region R1. According to some embodiments, in this operation, the first to third dielectric layers 114, 115, and 116 on the interlayer insulating layer 190 may also be removed.

Figure 7H:
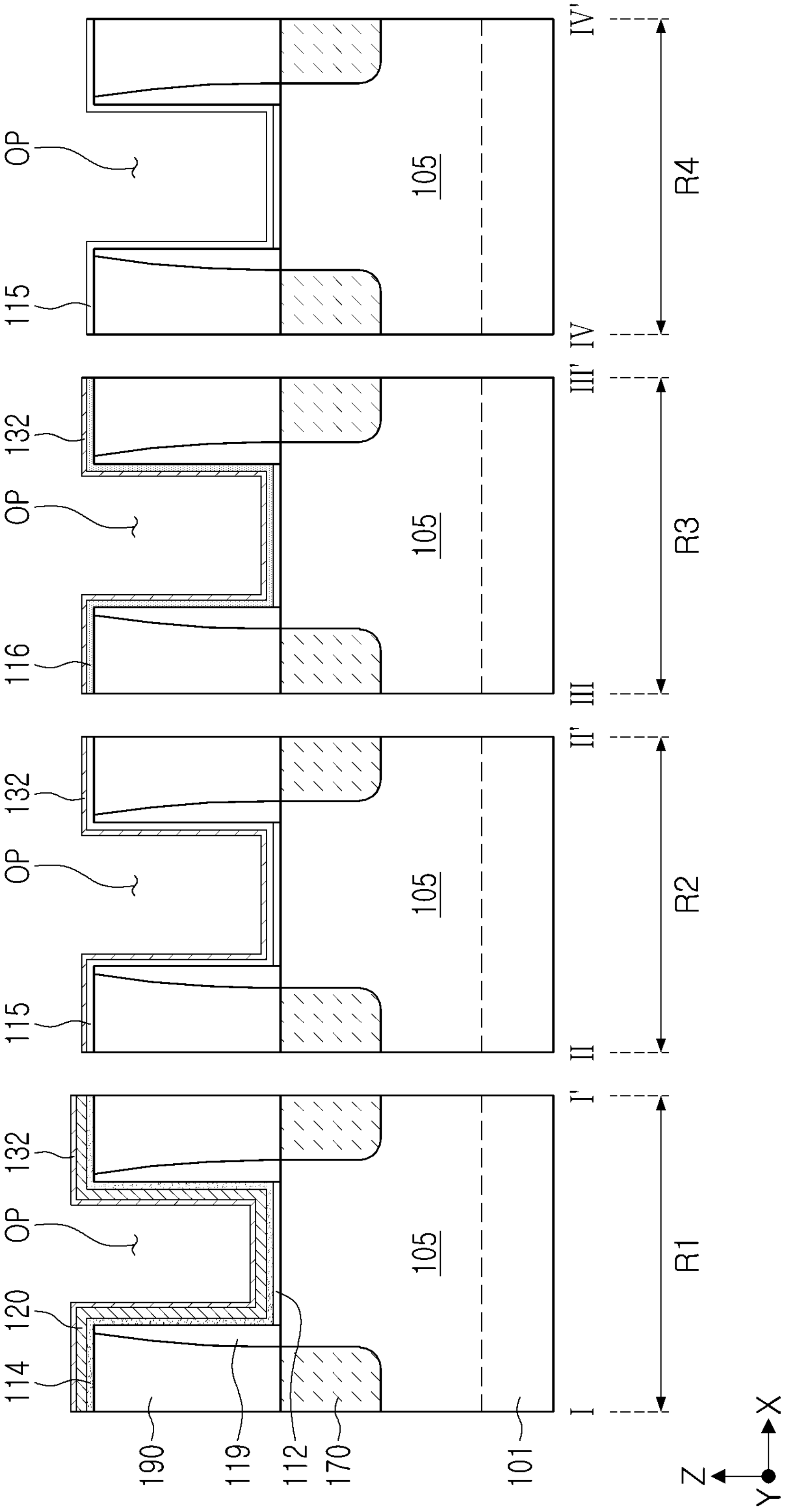

Referring to FIGS. 6 and 7H, first layers 132 of second conductive layers 130*a* may be formed in the first to third regions R1, R2, and R3 (S180).

The first layers 132 may be layers for forming a portion of the second conductive layer 130*a* by a subsequent process. First to fourth layers 132, 134, 136, and 138, including the second to fourth layers 134, 136, and 138 to be described below with reference to FIG. 71, may all be the same material. The second conductive layer 130*a* may be formed of the first to fourth layers 132, 134, 136, and 138. The first layer 132 may be removed only from the fourth region R4 after being deposited over the first to fourth regions R1, R2, R3, and R4.

Figure 7I:
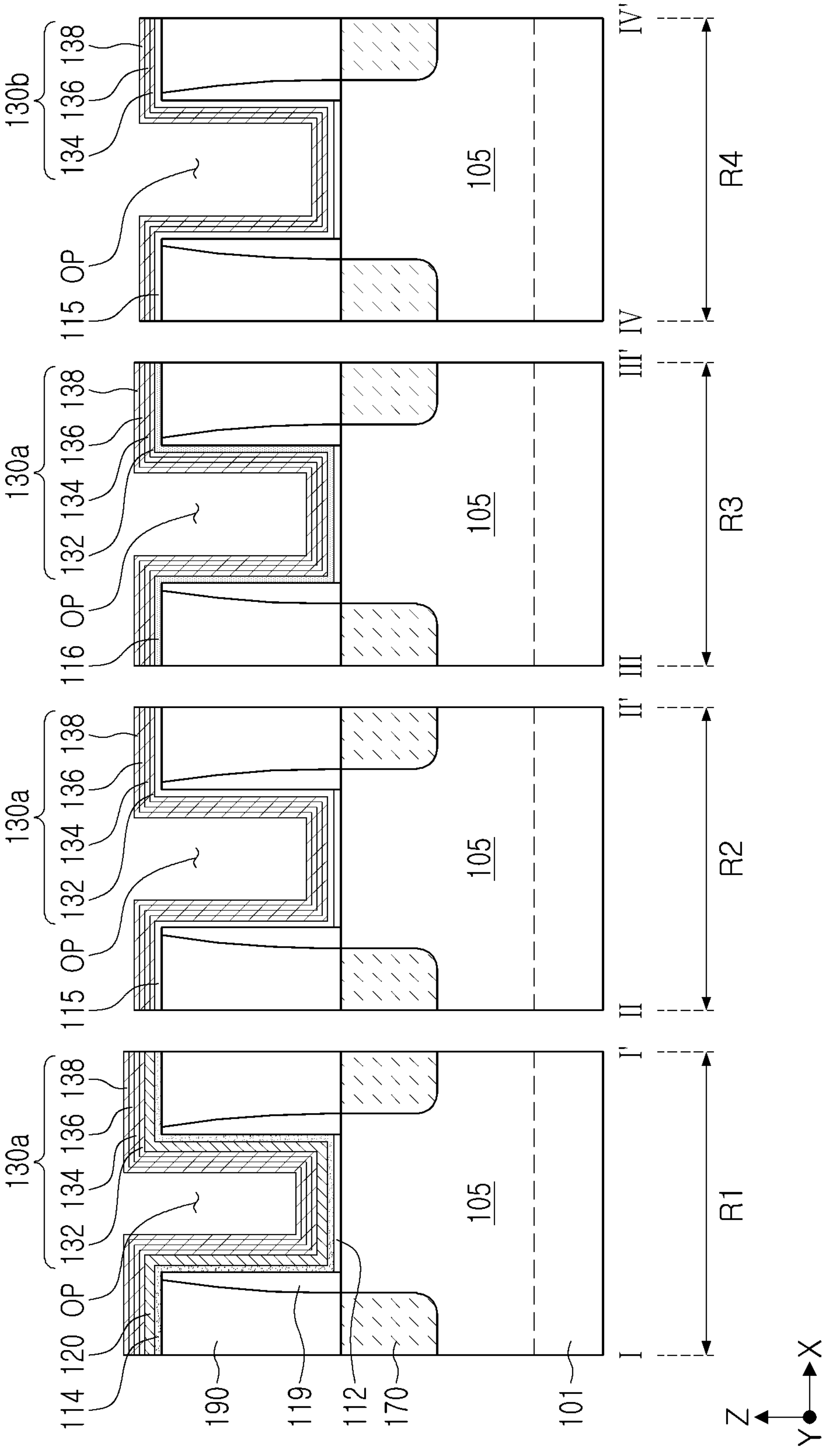

Referring to FIGS. 6 and 7I, second to fourth layers 134, 136, and 138 of the second conductive layer 130*a* may be sequentially formed (S190).

The second to fourth layers 134, 136, and 138 may be layers for forming a portion of the second conductive layer 130*a*, and may be layers for forming a fourth conductive layer 130*b*. The second to fourth layers 134, 136 and 138 may be formed in each of the first to fourth regions R1, R2, R3, and R4. A thickness of each of the second to fourth layers 134, 136, and 138 may be the same or similar to a thickness of the first layer 132, but is not limited to the illustrated thickness, and may be variously changed according to embodiments. The first to fourth layers 132, 134, 136, and 138 may be made of the same material, and thus interfaces therebetween may not be distinguished.

By this operation, in the first to third regions R1, R2, and R3, the second conductive layer 130*a* including the first to fourth layers 132, 134, 136, and 138 may be formed, and, in the fourth region R4, the fourth conductive layer 130*b* including second to fourth layers 134, 136, and 138 may be formed.

The embodiment of FIG. 4A may be implemented by forming a portion of the second to fourth layers 134, 136, and 138, removing layers deposited to a predetermined depth from the upper portion of the opening OP, and depositing remaining layers of the second to fourth layers 134, 136, and 138, in this operation. The embodiment of FIG. 5 may be implemented by forming three layers of the second to fourth layers 134, 136, and 138 in the fifth and sixth regions R5 and R6, and forming two layers among the second to fourth layers 134, 136, and 138 in the seventh and eighth regions R7 and R8, in this operation.

Figure 7J:
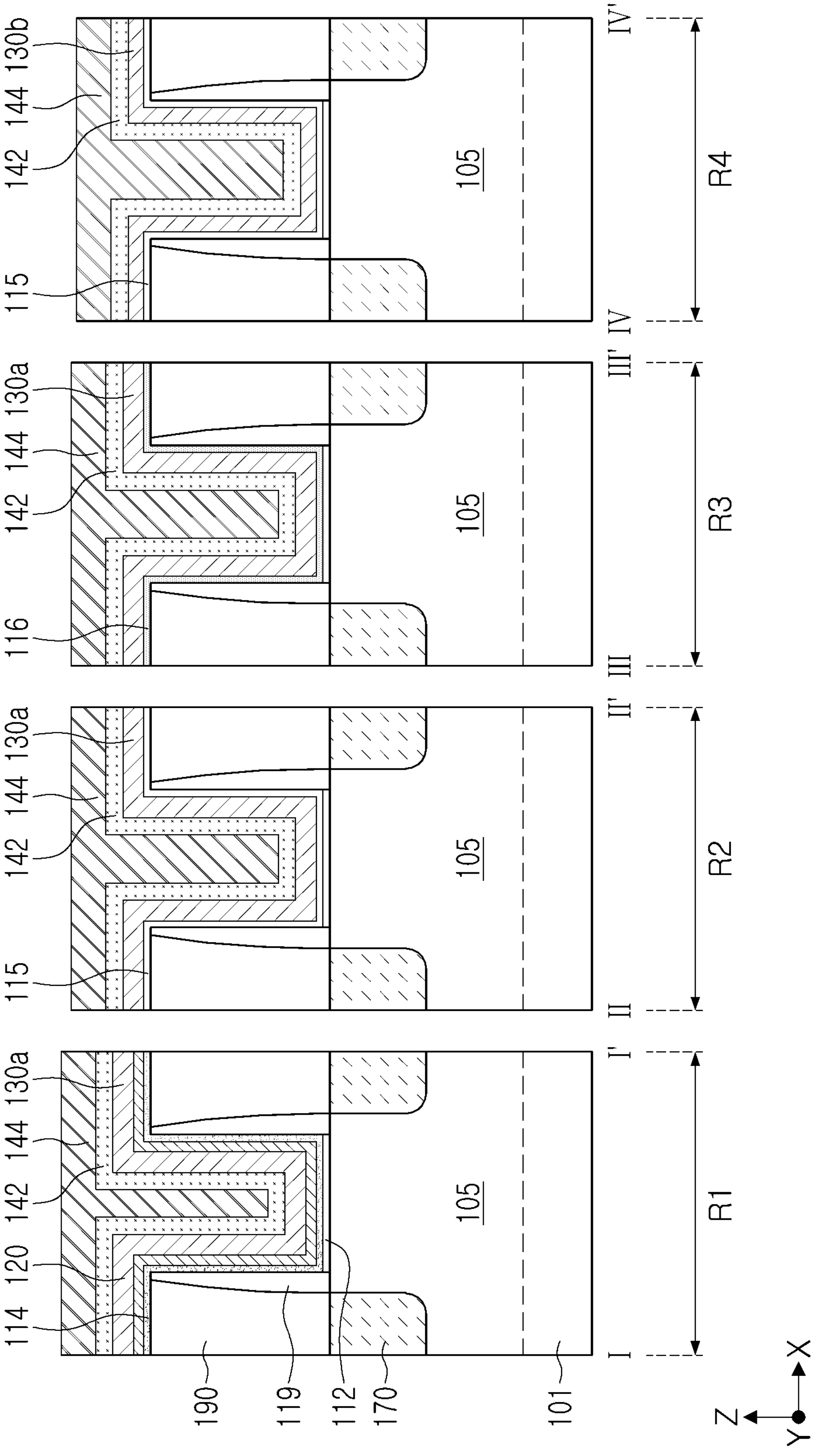

Referring to FIGS. 6 and 7J, third conductive layers 142 and upper conductive layers 144 may be sequentially formed (S200).

The third conductive layers 142 may be formed of a material having a lower work function than the second conductive layer 130*a* and the fourth conductive layer 130*b*. For example, the third conductive layers 142 may include TiAl, TiAlC, TiAlN, or a combination thereof. The upper conductive layers 144 may be made of a different material from the third conductive layers 142, and may include, for example, TiN, TaN, or a combination thereof. The openings OP may be completely filled by the third conductive layers 142 and the upper conductive layers 144.

In example embodiments, a conductive layer may be further formed on the upper conductive layer 144 in this operation. The further formed conductive layer may be deposited, may be then removed in a process operation described below with reference to FIG. 7K, and thus may not remain, or may be deposited in the openings OP to form the semiconductor device 100*c* of the embodiment of FIG. 4B.

Figure 7K:
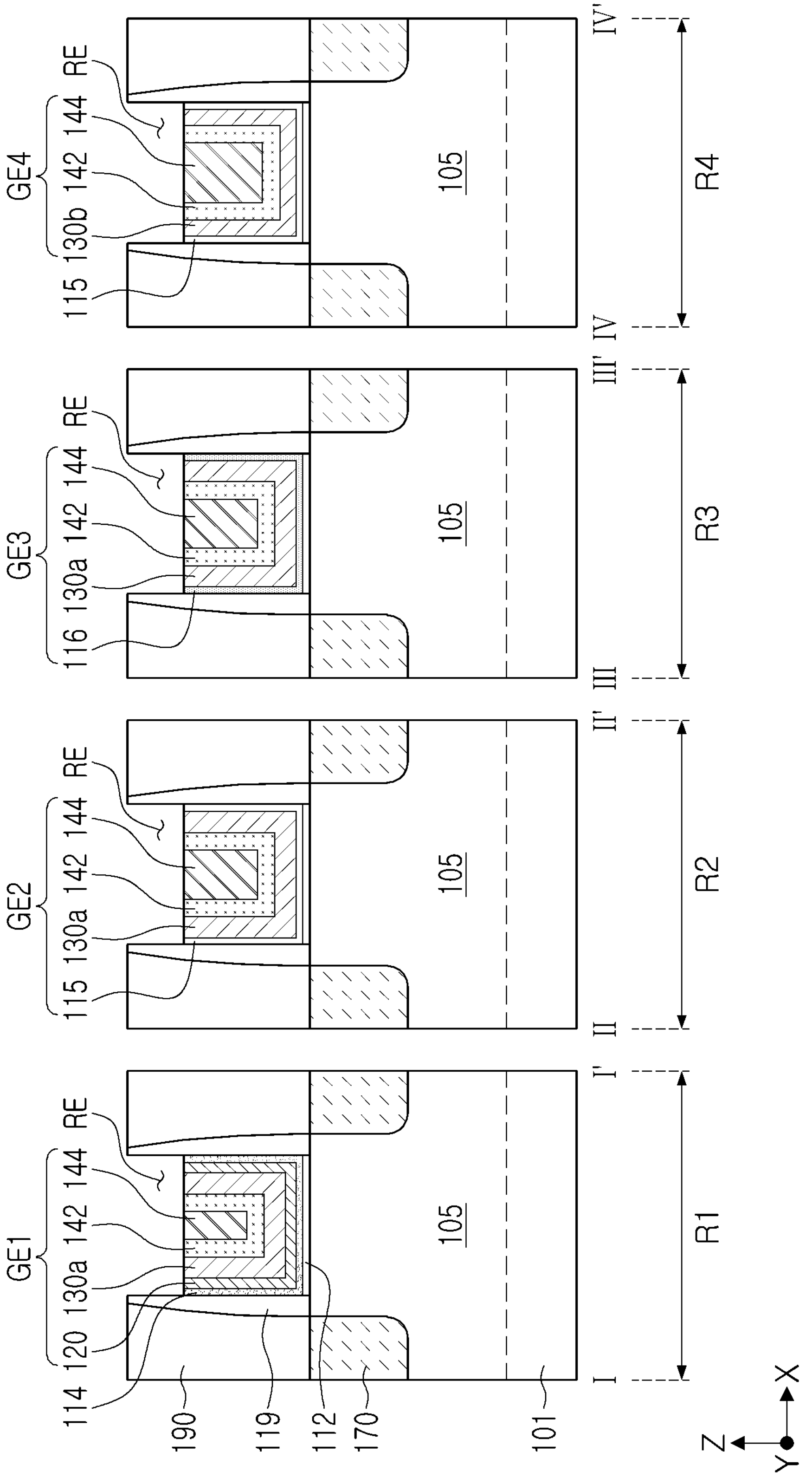

Referring to FIG. 7K, upper portions of the first conductive layers 120, upper portions of the second conductive layers 130*a*, an upper portion of the fourth conductive layer 130*b*, upper portions of the third conductive layers 142, and upper portions of the upper conductive layer 144 may be partially removed.

First, portions of the first conductive layers 120, the second conductive layers 130*a*, the fourth conductive layer 130*b*, the third conductive layers 142, and the upper conductive layers 144 may be removed on the interlayer insulating layers 190. Portions of the first to third gate dielectric layers 114, 115, and 116 may also be removed on the interlayer insulating layers 190, in this operation. A planarization process such as a chemical mechanical polishing (CMP) process may be used in the removal operation. By this operation, portions of the first conductive layers 120, the second conductive layers 130*a*, the fourth conductive layer 130*b*, the third conductive layers 142, and the upper conductive layers 144, may remain only in the openings OP.

Next, the first to third gate dielectric layers 114, 115, and 116, the first conductive layers 120, the second conductive layers 130*a*, the fourth conductive layer 130*b*, and the third conductive layers 142, and the upper conductive layers 144 may be removed from the upper surface of the interlayer insulating layers 190 by a predetermined depth, to form recess regions RE. In example embodiments, depths of the recess regions RE may be substantially the same in the first to fourth regions R1, R2, R3, and R4. Alternatively, depths of the recess regions RE may be different from each other due to a difference in etch rate, depending on materials of the first to fourth gate electrode layers GE1, GE2, GE3, and GE4. By this operation, the first to fourth gate electrode layers GE1, GE2, GE3, and GE4 may be finally formed in the first to fourth regions R1, R2, R3, and R4, respectively.

The embodiment of FIG. 4C may be implemented by controlling shapes of the recess regions RE formed in this operation.

Next, referring to FIG. 2A together, the gate capping layers 150 filling the recess regions RE may be formed on the first to fourth gate electrode layers GE1, GE2, GE3, and GE4. Therefore, the first to fourth transistors TR1, TR2, TR3, and TR4 of FIGS. 1 to 2B may be finally formed.

A semiconductor device with improved electrical characteristics may be provided by diversifying structures of a gate dielectric layer and a gate electrode layer of transistors to provide various operating voltages.

Various advantages and effects of the present inventive concept are not limited to the above, and will be more easily understood in the course of describing specific embodiments of the present inventive concept.

While example embodiments have been illustrated and described above, it will be apparent to those skilled in the art that modifications and variations could be made without departing from the scope of the present inventive concept as defined by the appended claims. That is, above-described subject matter is to be considered illustrative, and not restrictive, and the appended claims are intended to cover all such modifications, enhancements, and other embodiments, which fall within the true spirit and scope of the inventive concept. Accordingly, the scope of the appended claims shall not be restricted or limited by the foregoing detailed description.

What is claimed is:

1. A semiconductor device comprising:

a substrate comprising a first region and a second region;

a first gate structure in the first region and comprising a first gate dielectric layer, a first conductive layer, a second conductive layer, and a third conductive layer, stacked in sequence; and a second gate structure in the second region and comprising a second gate dielectric layer, the second conductive layer, and the third conductive layer, stacked in sequence, wherein the first gate dielectric layer and the first conductive layer comprise a first element, and wherein the second conductive layer and the second gate dielectric layer are free of the first element, wherein the second gate dielectric layer is positioned on at least a first surface and a second surface of the second conductive layer, and wherein a first transistor comprising the first gate structure and a second transistor comprising the second gate structure define respective p-type MOSFETs.

2. The semiconductor device according to claim 1, wherein the first element comprises at least one of aluminum (Al), tantalum (Ta), tungsten (W), manganese (Mn), chromium (Cr), ruthenium (Ru), platinum (Pt), gallium (Ga), germanium (Ge), or gold (Au).

3. The semiconductor device according to claim 1, wherein the first gate structure further comprises a lower conductive layer disposed between the first gate dielectric layer and the first conductive layer.

4. The semiconductor device according to claim 3, wherein a thickness of the lower conductive layer is in a range of about 2 Angstroms (Å) to about 10 Å.

5. The semiconductor device according to claim 1, wherein the second gate dielectric layer comprises a second element that is different from the first element, and wherein the first gate dielectric layer is free of the second element.

6. The semiconductor device according to claim 1, wherein the second gate dielectric layer is directly on the second conductive layer, and the second conductive layer is directly on the third conductive layer.

7. The semiconductor device according to claim 1, wherein the second gate dielectric layer comprises at least one of hafnium (Hf), titanium (Ti), zirconium (Zr), or praseodymium (Pr).

8. The semiconductor device according to claim 1, wherein a thickness of the second conductive layer is greater than a thickness of the first conductive layer.

9. The semiconductor device according to claim 1, wherein a thickness of the third conductive layer is greater than a thickness of the first conductive layer.

10. The semiconductor device according to claim 1, wherein a material of the third conductive layer is the same as a material of the first conductive layer.

11. The semiconductor device according to claim 1, wherein the first and second transistors have substantially same respective channel lengths.

* * * * *